United States Patent
Sandhu et al.

(10) Patent No.: US 9,985,049 B1
(45) Date of Patent: May 29, 2018

(54) ARRAYS OF ELEVATIONALLY-EXTENDING STRINGS OF MEMORY CELLS AND METHODS OF FORMING MEMORY ARRAYS

(71) Applicant: Micron Technology, Inc., Boise, ID (US)

(72) Inventors: Gurtej S. Sandhu, Boise, ID (US); Richard J. Hill, Boise, ID (US); John A. Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 15/581,762

(22) Filed: Apr. 28, 2017

(51) Int. Cl.
| | |
|---|---|
| *H01L 21/8238* | (2006.01) |
| *H01L 27/11582* | (2017.01) |
| *H01L 21/28* | (2006.01) |
| *H01L 29/10* | (2006.01) |
| *H01L 21/02* | (2006.01) |
| *H01L 29/66* | (2006.01) |
| *H01L 21/306* | (2006.01) |
| *H01L 27/11556* | (2017.01) |

(52) U.S. Cl.
CPC .. *H01L 27/11582* (2013.01); *H01L 21/02236* (2013.01); *H01L 21/02532* (2013.01); *H01L 21/28273* (2013.01); *H01L 21/28282* (2013.01); *H01L 21/30604* (2013.01); *H01L 27/11556* (2013.01); *H01L 29/1037* (2013.01); *H01L 29/66545* (2013.01)

(58) Field of Classification Search
CPC ......... H01L 27/11582; H01L 21/02236; H01L 21/02532; H01L 21/28273

USPC ......... 257/314, 315, 319, 320; 438/211, 257
See application file for complete search history.

(56) References Cited

U.S. PATENT DOCUMENTS

| | | | |
|---|---|---|---|
| 2011/0147824 A1* | 6/2011 | Son ..................... | G11C 16/0483 257/324 |
| 2014/0203344 A1 | 7/2014 | Hopkins et al. | |
| 2016/0099323 A1 | 4/2016 | Hopkins | |

* cited by examiner

*Primary Examiner* — Tan N Tran
(74) *Attorney, Agent, or Firm* — Wells St. John P.S.

(57) ABSTRACT

An array of elevationally-extending strings of memory cells comprises a vertical stack of alternating insulative levels and wordline levels. The wordline levels have terminal ends corresponding to control-gate regions. Charge-storage material of individual memory cells extend elevationally along individual of the control-gate regions of the wordline levels and do not extend elevationally along the insulative levels. A charge-blocking region of the individual memory cells extends elevationally along the individual control-gate regions of the wordline levels laterally through which charge migration between the individual control-gate regions and the charge-storage material is blocked. Channel material extends elevationally along the stack and is laterally spaced from the charge-storage material by insulative charge-passage material. All of the charge-storage material of individual of the elevationally-extending strings of memory cells is laterally outward of all of the insulative charge-passage material of the individual elevationally-extending strings of memory cells. Other embodiments, including method embodiments, are disclosed.

28 Claims, 20 Drawing Sheets

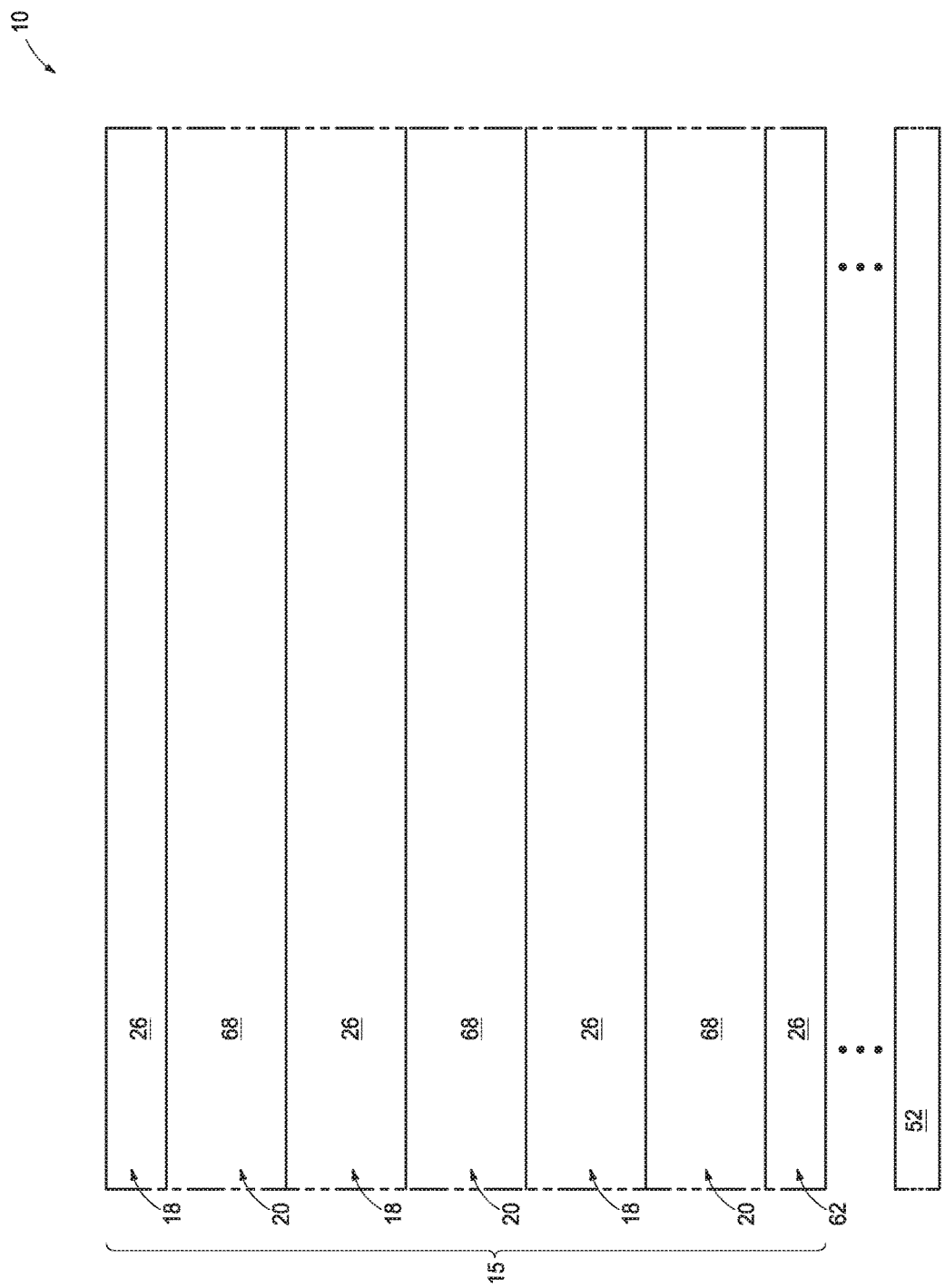

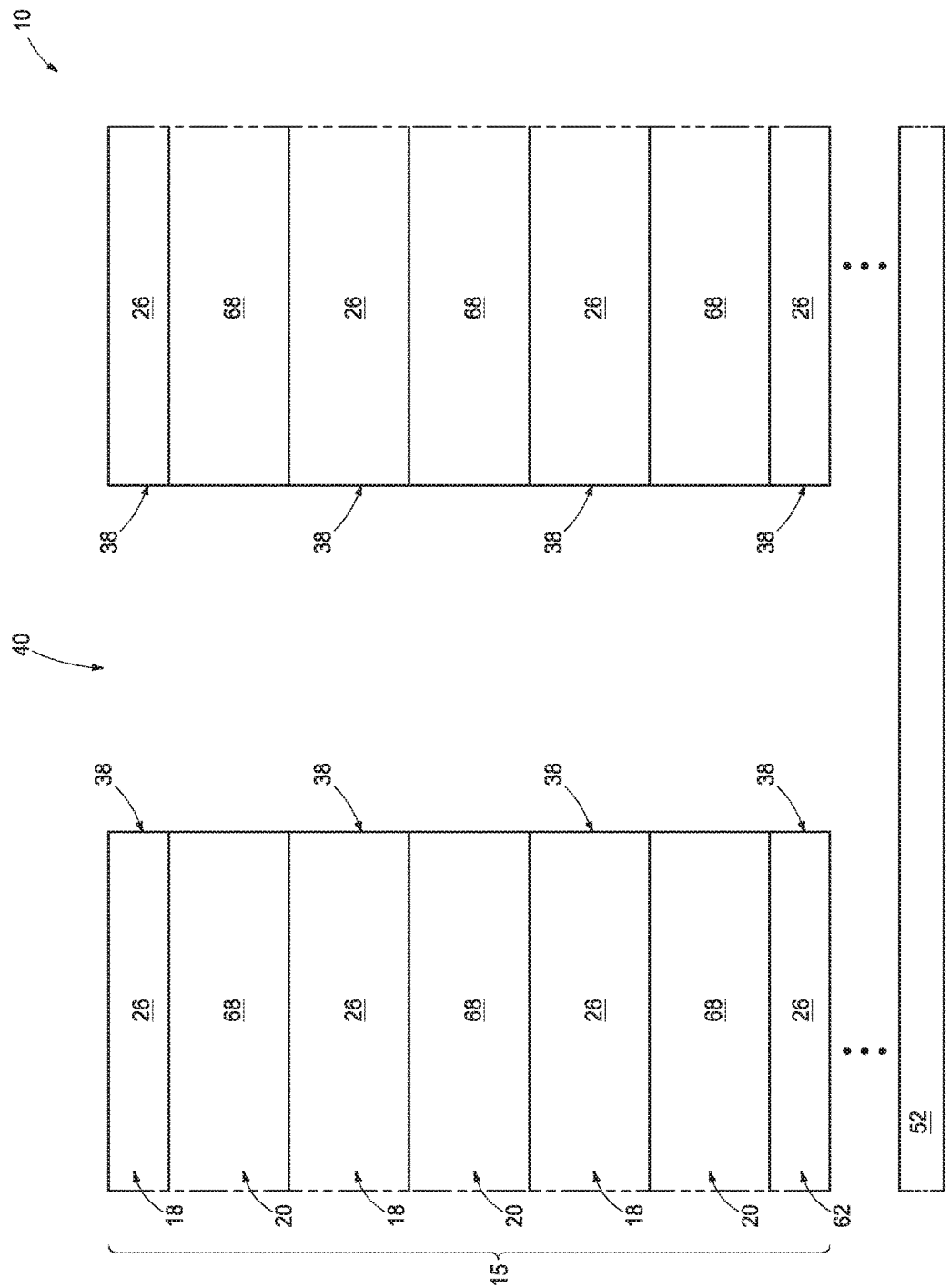

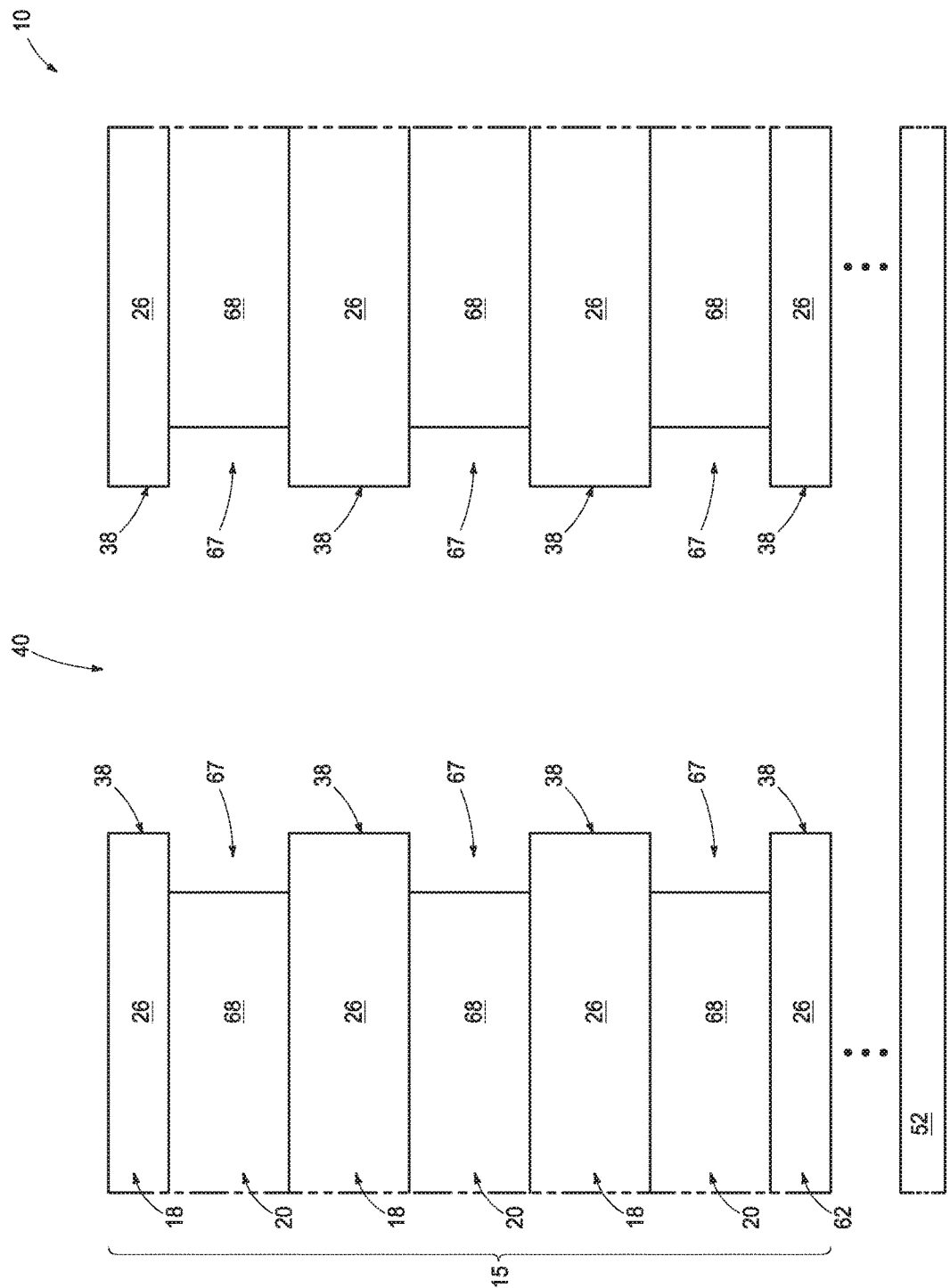

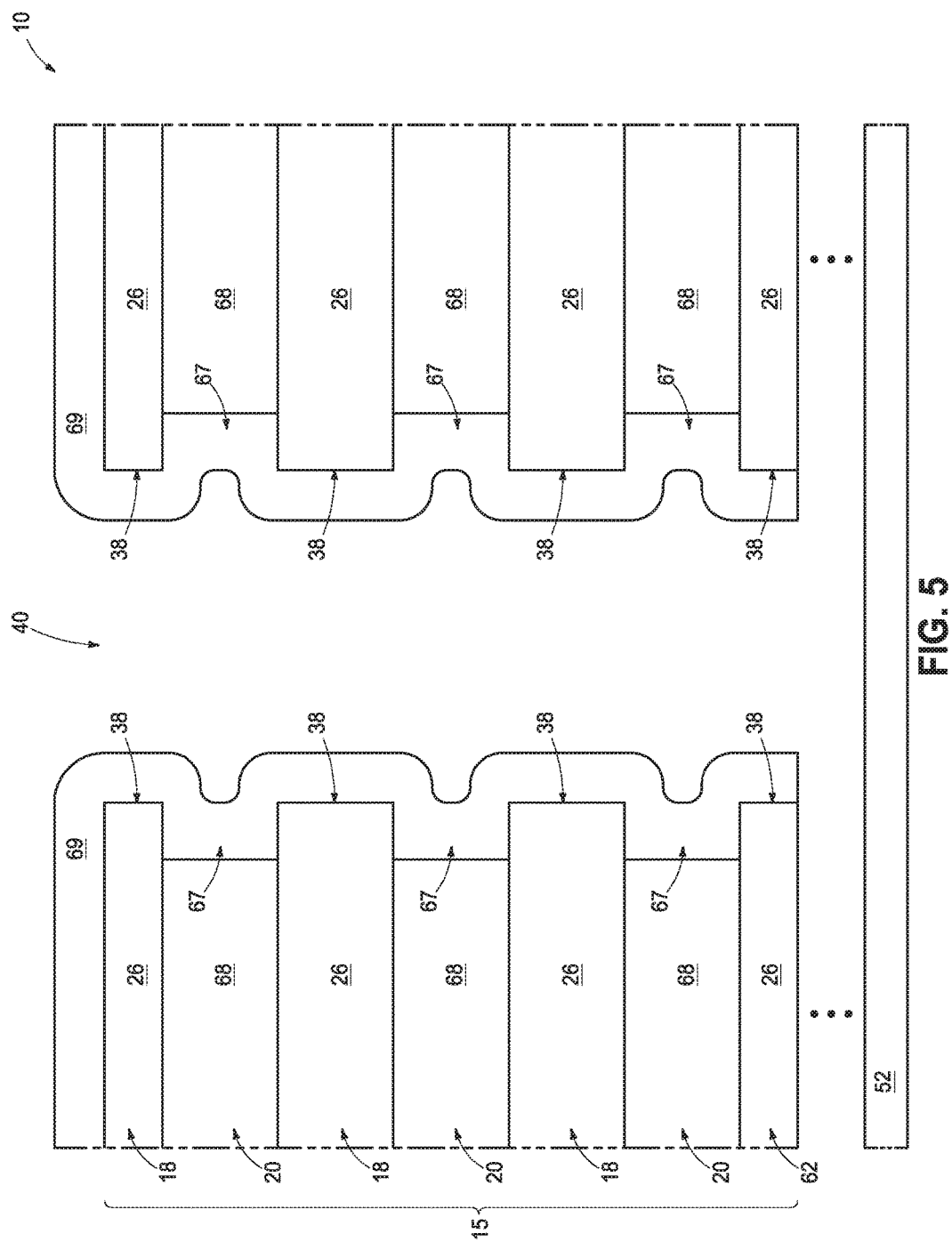

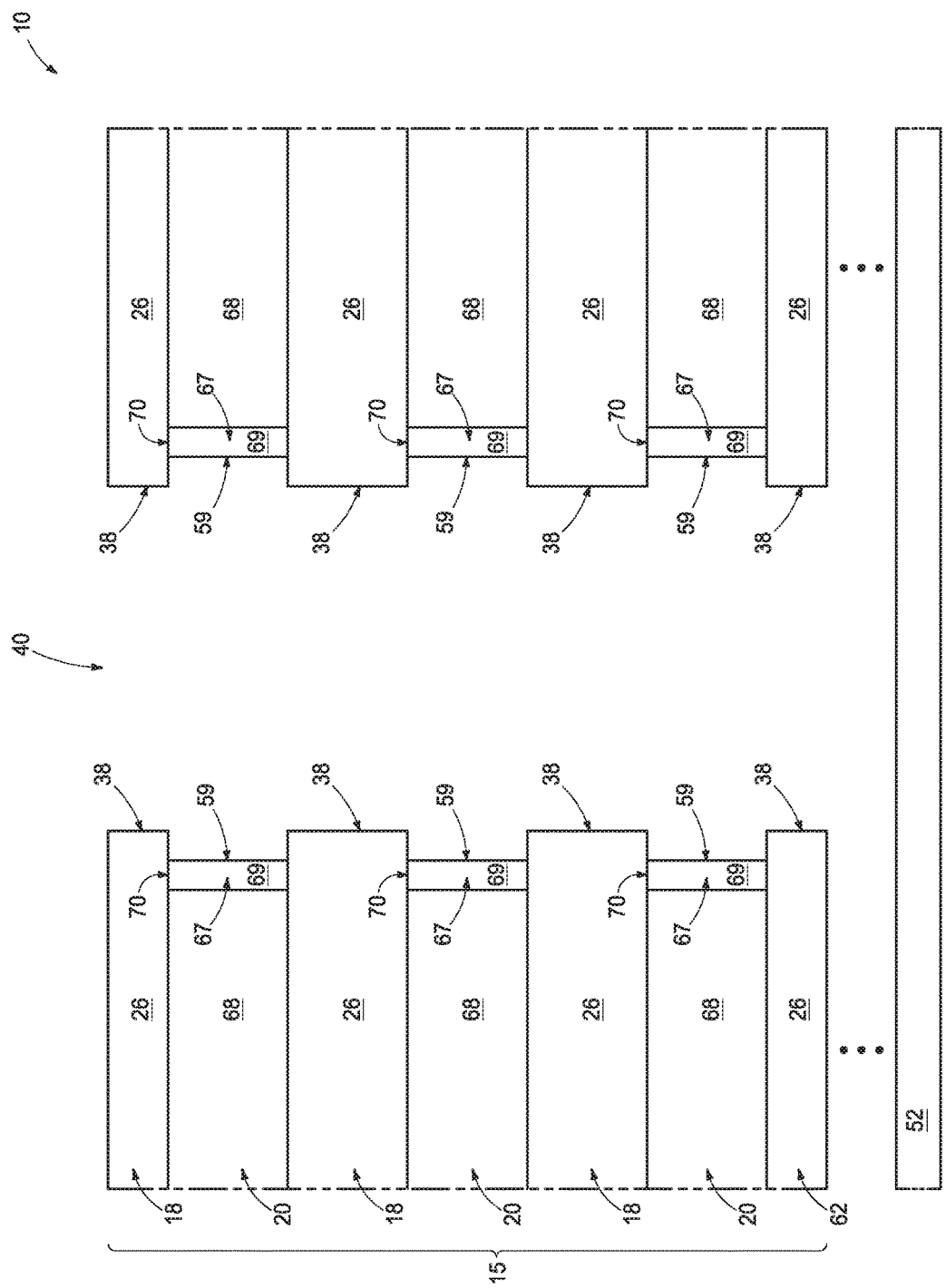

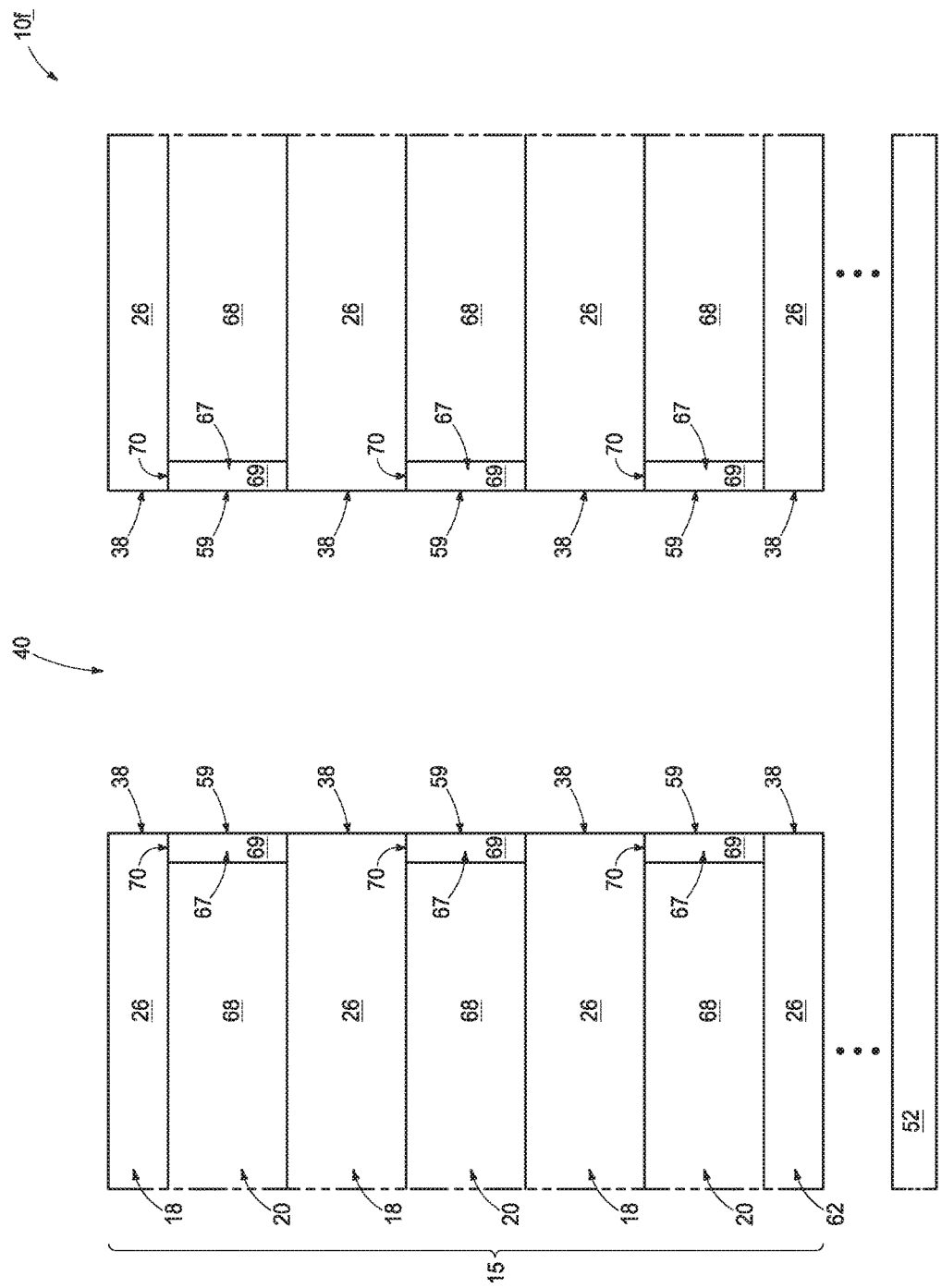

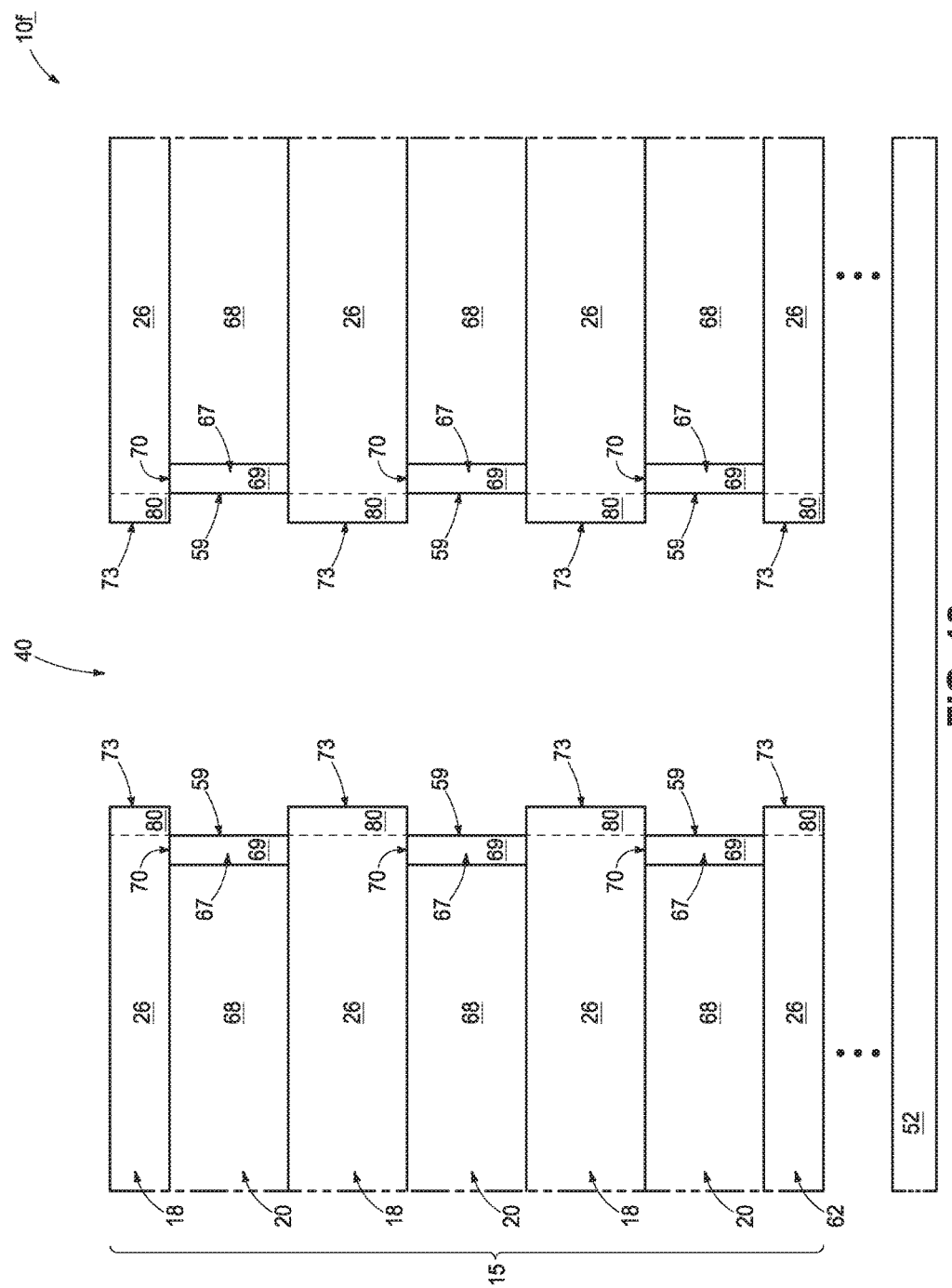

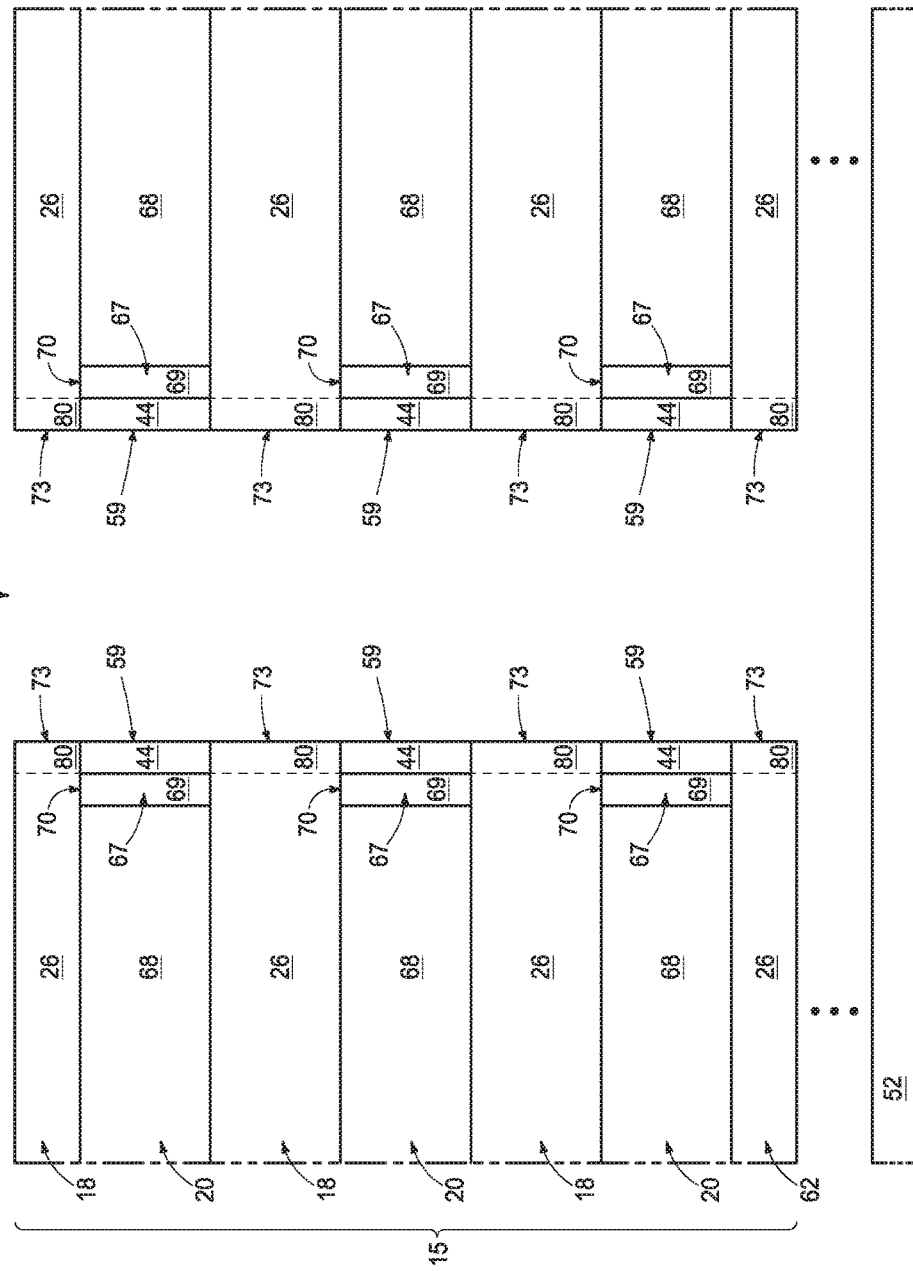

US 9,985,049 B1

ARRAYS OF ELEVATIONALLY-EXTENDING STRINGS OF MEMORY CELLS AND METHODS OF FORMING MEMORY ARRAYS

TECHNICAL FIELD

Embodiments disclosed herein pertain to arrays of elevationally-extending strings of memory cells and to methods of forming memory arrays.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells. It is desired to develop improved NAND architecture.

BRIEF DESCRIPTION OF THE DRAWINGS

FIG. 2 is a diagrammatic cross-sectional view of a substrate construction in process in accordance with an embodiment of the invention.

FIG. 3 is a view of the FIG. 2 construction at a processing step subsequent to that shown by FIG. 2.

FIG. 4 is a view of the FIG. 3 construction at a processing step subsequent to that shown by FIG. 3.

FIG. 5 is a view of the FIG. 4 construction at a processing step subsequent to that shown by FIG. 4.

FIG. 6 is a view of the FIG. 5 construction at a processing step subsequent to that shown by FIG. 5.

FIG. 17 is a diagrammatic cross-sectional view of a substrate construction in process in accordance with an embodiment of the invention.

FIG. 18 is a view of the FIG. 17 construction at a processing step subsequent to that shown by FIG. 17.

FIG. 21 is a view of the FIG. 18 construction at a processing step subsequent to that shown by FIG. 20.

DETAILED DESCRIPTION OF EXAMPLE EMBODIMENTS

Operation of NAND memory cells may comprise movement of charge between a channel material and a charge-storage material. For instance, programming of a NAND memory cell may comprise moving charge (electrons) from the channel material into the charge-storage material, and then storing the charge within the charge-storage material. Erasing of the NAND memory cell may comprise moving holes into the charge-storage material to recombine with electrons stored in the charge-storage material, and thereby release charge from the charge-storage material. The charge-storage material may comprise charge-trapping material (for instance, silicon nitride, silicon, metal dots, etc.) which reversibly traps charge carriers. A problem with conventional NAND can be that charge-trapping material extends across multiple memory cells of a memory array, and can enable charge migration between the cells. The charge migration between memory cells may lead to data retention problems. Although examples described herein pertain to NAND memory, it is to be understood that structures and methods described herein may pertain to other memory and architectures in other embodiments. Example embodiments of an array of elevationally-extending strings of memory cells are initially described with reference to FIG. 1. This is followed by description of example method embodiments. Such include methods of forming a memory array including, but not limited to, the memory array of FIG. 1, and are described with reference to FIGS. 2-22.

Figure 1:
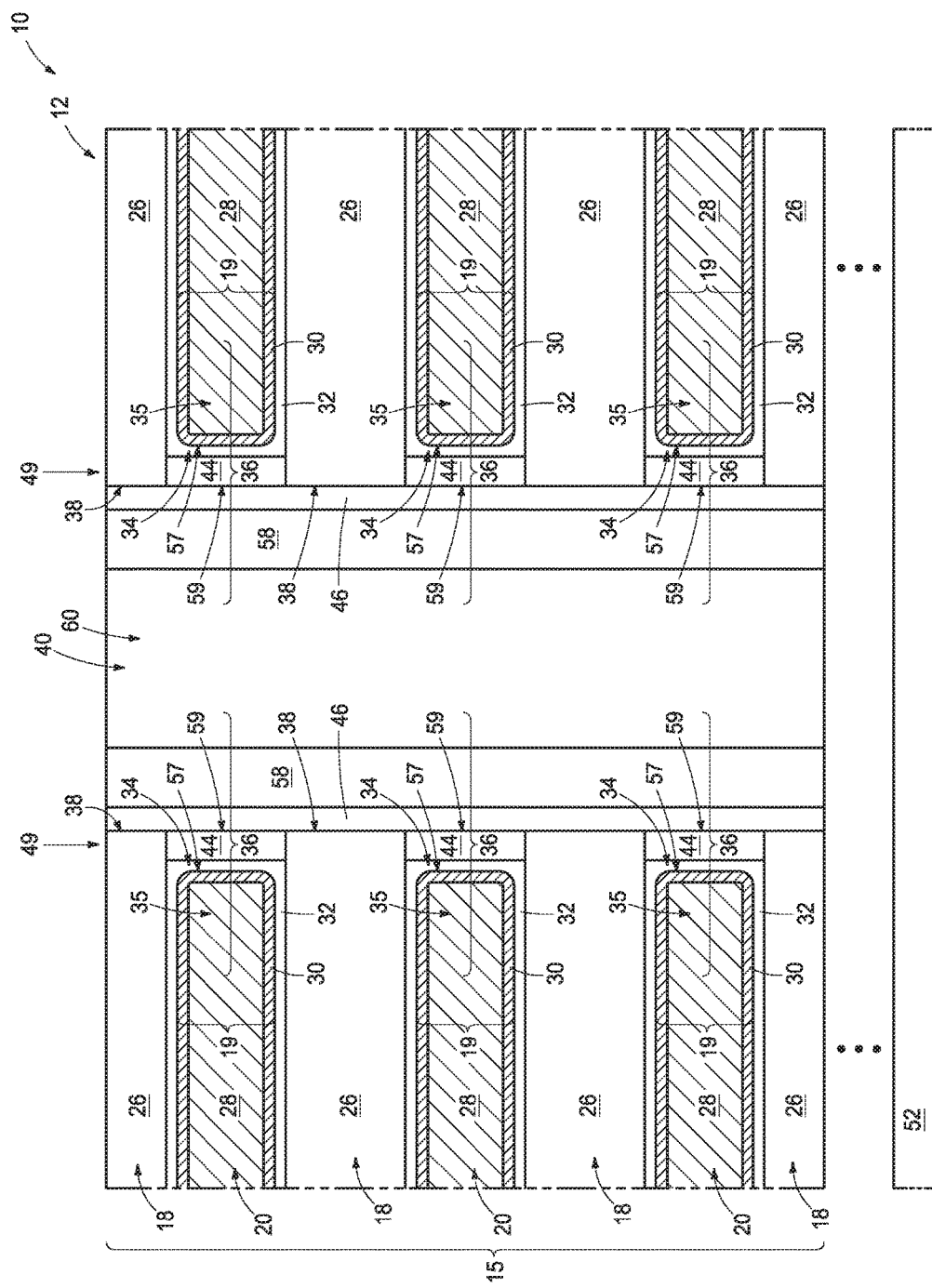
FIG. 1 is a diagrammatic cross-sectional side view of an example integrated structure having a region of an example NAND memory array.

Referring to FIG. 1, a portion of an integrated structure 10 is illustrated, with such portion being a fragment of a 3-dimensional (3D) NAND memory array 12. Integrated structure 10 comprises a vertical stack 15 comprising vertically-alternating levels 18 and 20. Example levels 20 comprise conductor/conducting/conductive (i.e., electrical herein) material 19. Example levels 18 comprise insulator/insulating/insulative (i.e., electrical herein) material 26 and may be referred to as insulative levels 18. An example insulator material 26 is doped or undoped silicon dioxide. In one embodiment and as shown, conductive material 19 comprises conductive materials 28 and 30. In one embodiment, conductive material 28 may be considered to be a conductive core, and conductive material 30 may be considered to be an outer conductive layer surrounding the conductive core. Conductive materials 28 and 30 may comprise different compositions relative one another. Examples for each include elemental metals (e.g., tungsten, titanium, copper, etc.), conductive metal compounds (e.g., metal nitrides, metal silicides, metal carbides, etc.), and conductively-doped-semiconductive materials (e.g., silicon, gallium, etc.), including mixtures thereof. In one embodiment, an insulator material 32 forms an insulative liner surrounding outer conductive material layer 30, and may comprise any suitable insulator material and may be a high-k material (e.g., aluminum oxide), where "high-k" means a dielectric constant greater than that of silicon dioxide. An example thickness for insulator material 32 is 2 nm to 10 nm. Alternately, and by way of examples only, insulator material 32 may be eliminated and/or conductive material 19 may be homogenous. Levels 18 and 20 may be of any suitable vertical thicknesses. In some embodiments, levels 18 and levels 20 may have respective vertical thicknesses of about 10 nanometers (nm) to 300 nm. In some embodiments, levels 18 and 20 have the same vertical thickness and in other embodiments have different vertical thicknesses.

In the example embodiment, insulator material 26 forms sidewalls 38. Sidewalls 38 may be considered to be part of sidewalls of an opening 40 extending through stack 15. Opening 40 may have a continuous shape when viewed from above or in horizontal cross-section, and may be, for example, circular, elliptical, etc. Accordingly, sidewalls 38 of FIG. 1 may be comprised by a continuous sidewall that extends around the periphery of opening 40.

In some embodiments, levels 20 may be wordline levels of a NAND memory array. Example terminal ends 34 of wordline levels 20 may function as control-gate regions 35 of NAND memory cells 36, with approximate locations of memory cells 36 being indicated with brackets in FIG. 1. As shown, memory cells 36 are vertically stacked and form an elevationally-extending (e.g., vertical) string 49 of memory cells 36 (e.g., a NAND string), with the number of memory cells in each string being determined at least in part by the number of levels 20. The stack may comprise any suitable number of conductive-material-containing levels 20. For instance, the stack may have 8 such levels, 16 such levels, 32 such levels, 64 such levels, 512 such levels, 1028 such levels, etc. Additionally, memory cells 36 may be constructed to effectively be completely encircling relative to individual openings 40 such that each opening 40 has one and only one elevationally-extending string 49 (e.g., individual string 49 in horizontal cross-section being a continuous-completely-encircling-annular ring). Alternately, memory cells 36 may be constructed to effectively not be completely encircling relative to individual openings 40 such that each opening 40 may have two or more elevationally-extending strings 49 (e.g., multiple memory cells 36 with multiple wordlines per level 20). Regardless, in one embodiment, sidewall 38 for individual strings 49 is a laterally (e.g., radially) innermost surface 38 in vertical cross-section (e.g., the FIG. 1 cross-section) that is planar, and in one such embodiment that is vertical.

Channel material 58 extends elevationally along vertical stack 15 within opening 40. Such may comprise any suitable material, for example comprising, consisting essentially of, or consisting of appropriately-doped silicon. Channel material 58 as shown comprises an elevationally-extending cylinder, for example as a commonly termed hollow-channel configuration. A radially internal volume of channel material 58 may comprise a void space (not shown) or may comprise insulative material 60 extending along a middle of opening 40 radially within channel material 58. Insulative material 60 may comprise, for example, silicon dioxide, silicon nitride, etc. In another example embodiment, channel material 58 may entirely fill (not shown) the central region of opening 40 to form an elevationally-extending pedestal of channel material within such central region.

Insulator charge-passage material 46 is within opening 40 and in one embodiment extends elevationally along stack 15. Material 46 may comprise any suitable composition(s), and in some embodiments may comprise, consist essentially of, or consist of a bandgap-engineered structure having nitrogen-containing material laterally sandwiched between two insulator oxides. The nitrogen-containing material may be, for example, silicon nitride. The two oxides may be the same composition as one another, or may comprise different compositions relative to one another, and in some embodiments may both be silicon dioxide. An example horizontal thickness for material 46 is 15 nm to 30 nm.

Charge-storage material 44 of individual memory cells 36 extends elevationally along individual of control-gate regions 35 of wordline levels 20 and does not extend elevationally along insulative levels 18. Insulator charge-passage material 46 is between and laterally (e.g., radially) spaces charge-storage material 44 and channel material 58 from one another. Charge-storage material 44 may comprise any suitable composition(s), and in some embodiments may comprise floating gate material (for instance, doped or undoped silicon) or charge-trapping material (for instance, silicon nitride, metal dots, etc.). In some embodiments, charge-storage material 44 may comprise, consist essentially of, or consist of silicon nitride. In some embodiments, charge-storage material 44 may consist of silicon nitride, and may have a thickness of 15 nm to 500 nm. In one embodiment, charge-storage material 44 of individual memory cells 36 has a laterally (e.g., radially) innermost surface 59 in vertical cross-section (e.g., the FIG. 1 cross-section) that is planar, and in one such embodiment that is vertical.

In one embodiment and as shown, all charge-storage material 44 of individual elevationally-extending strings 49 of memory cells 36 is laterally (e.g., radially) outward of all insulator charge-passage material 46 of individual elevationally-extending strings 49 of memory cells 36 (i.e., no material 46 is atop, under, or laterally outward of material 44). In one embodiment, charge-storage material 44 of individual elevationally-extending strings 49 of memory cells 36 and insulator material 26 of insulative levels 18 each have planar-laterally-innermost surfaces in vertical cross-section that are co-planar (e.g., sidewall surface 38 of material 26 and sidewall surface 59 of material 44).

Charge-passage material 46 can function as a material through which charge carriers tunnel (e.g., Fowler-Nordheim tunneling, Frenkel-Poole tunneling, direct tunneling, trap-assisted tunneling, etc.) or otherwise pass during programming operations, erasing operations, etc. Charge-passage material 46 may be engineered to have appropriate properties to provide sufficient EOT to preclude undesired back-migration (i.e., leakage) of charge carriers from charge-storage material 44 to channel material 58 while also permitting charge carriers within charge-storage material 44 to be removed from material 44 (i.e., transferred from charge-storage material 44 to channel material 58) during an ERASE operation.

A charge-blocking region is within levels 20. A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells. Such a charge-blocking region is laterally (e.g., radially) outward of charge-passage material 46 and laterally (e.g., radially) inward of conductive material 19. An example charge-blocking region as shown comprises insulator material 32. By way of further examples, a charge-blocking region may comprise a laterally (e.g., radially) outer portion of the charge-storage material (e.g., material 44) where such charge-storage material is insulative (e.g., in the absence of any different-composition material between insulative-charge-storage material 44 and conductive material 19). Regardless, as an additional example, an interface of a charge-storage material and conductive material of a control gate may be sufficient to function as a charge-blocking region in the absence of any separate-composition-insulator material 32. Further, an interface 57 of conductive material 19 with material 32 (when present) in combination with insulator material 32 may together function as a charge-blocking region, and as alternately or additionally may a laterally-outer region of an insulative-charge-storage material (e.g., a silicon nitride material 44).

Stack 15 in the example embodiment is supported by a base 52. A break is shown between base 52 and stack 15 to indicate that there may be additional materials and/or integrated circuit structure between base 52 and stack 15. In some applications, such additional integrated materials may include, for example, source-side select gate material (SGS material). Base 52 may comprise semiconductor material, for example, comprising, consisting essentially of, or consisting of monocrystalline silicon. Base 52 may be referred to as a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In some applications, base 52 may correspond to a semiconductor substrate containing one or more materials associated with integrated circuit fabrication. Such materials may include, for example, one or more of refractory-metal materials, barrier materials, diffusion materials, insulator materials, etc.

Embodiments as shown and described above may be fabricated using any existing or yet-to-be-developed methods. Example method embodiments are now described with reference to FIGS. 2-22 which may be used in fabricating the above-described embodiments or other structures that may not be in accordance with structural aspects of the invention. Like numerals from the above-described embodiments are used for predecessor constructions and materials where appropriate, with some differences being indicated with different numerals and letters.

Referring to FIG. 2, construction 10 is formed to include vertical stack 15 of alternating first levels 18 and second levels 20 over base 52. First levels 18 comprise first material 26 and second levels 20 comprise second material 68.

Second material 68 may be largely or entirely sacrificial and all or some of first material 26 may remain as part of the finished-circuitry construction. By way of examples only, second material 68 may be silicon nitride and first material 26 may be doped and/or un-doped silicon dioxide. Second levels 20 may ultimately become wordline levels 20 and first levels 18 may be insulative levels in the finished-circuitry construction.

Referring to FIG. 3, openings 40 have been formed to extend elevationally through first levels 18 and second levels 20. Only one opening is shown for brevity in the figures, although multiple such openings would be formed in a suitable horizontal pattern. Openings 40 may be formed using any suitable methods, and with or without pitch multiplication. In one embodiment, insulator material 26 of first levels 18 has a planar laterally (e.g., radially) innermost surface 38 in vertical cross-section (e.g., such as the vertical cross-section of FIG. 3) that is planar, and in one such embodiment that is vertical.

Referring to FIG. 4, and in one embodiment, second material 68 of second levels 20 has been laterally recessed relative to first material 26 of first levels 18 in openings 40 to form recesses 67 in second levels 20 in openings 40. Such may be conducted, by way of example, using any suitable wet or dry etching chemistry that etches second material 68 selectively relative to first material 26. In this document, a selective etch or removal is an etch or removal where one material is removed relative to another stated material at a rate of at least 2.0:1. By way of example only, when first material 26 comprises silicon dioxide and second material 68 comprises silicon nitride, a timed wet $H_3PO_4$ etching chemistry may be used.

Referring to FIG. 5 and in one embodiment, third material 69 has been deposited atop stack 15 and in openings 40 laterally along first levels 18 and in recesses 67 formed in second levels 20 by the act of laterally recessing as depicted in FIG. 4. Example third materials include semi-metals (e.g., doped and/or undoped silicon and germanium), elemental metal (e.g., indium, aluminum, cobalt, nickel, molybdenum, tungsten, etc.), and a metal compound (e.g., nitrides of the stated example elemental metals). In one embodiment, third material 69 is formed directly against second material 68.

Referring to FIG. 6, third material 69 has been etched to remove it from being atop stack 15, from extending along first levels 18, and to leave third material 69 in recesses 67, and thereby in one example forming vertically-spaced regions 70 of third material 69 in openings 40. Individual third-material regions 70 in openings 40 extend elevationally along second material 68 in second levels 20, and in one embodiment may be directly against second material 68. Some of first material 26 may be etched (not shown) when etching third material 69. In one embodiment and as shown, third-material regions 70 are laterally (e.g., radially) recessed outwardly relative to surfaces 38 of first material 26 in first levels 18. Alternately, no recessing of second material 68 may be conducted and/or vertically-spaced-third-material regions 70 may have laterally-innermost surfaces 59 that are laterally (e.g., radially) inward (not shown) of first-material-surfaces 38 or flush (e.g., co-planar, and not shown) therewith.

Such provides but example techniques of forming vertically-spaced regions 70, and other existing or yet-to-be-developed techniques may be used. For example, and by way of example only, vertically-spaced regions 70 might be formed selectively relative to second material 68 in comparison to first material 26.

Charge-storage material is ultimately formed in openings 40 elevationally along spaced-third-material regions 70 selectively relative to first levels 18. Such may occur by any existing or yet-to-be-developed techniques including, for example, activating and/or deactivating surfaces of materials 26 and third regions 70 within openings 40 by using one or more treatment materials, forming barrier materials, and/or forming monolayers on exposed surfaces of third regions 70 and/or first material 26.

Figure 7:
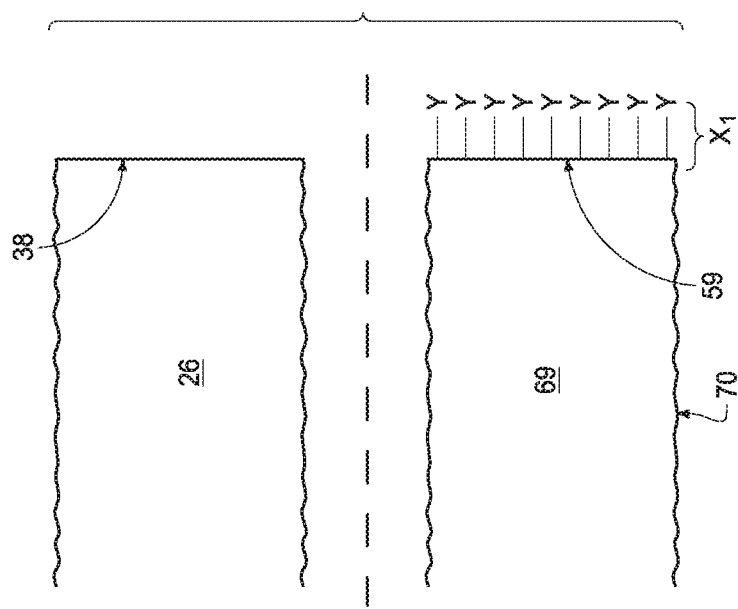
FIG. 7 is a diagrammatic enlarged view of certain materials of the FIG. 6 construction at a processing step subsequent to that shown by FIG. 6.

For example, and referring to FIG. 7 and by way of example only, consider first material 26 and second material 69 of a vertically-spaced region 70 as having a surface 38 and a surface 59, respectively, exposed to or within openings 40. In one embodiment, a chemically-bonded monolayer $X_1$ is formed on third material 69 in openings 40 selectively relative to first material 26 in openings 40, for example by bonding a species "Y" to surface 59 of third material 69. In this document, a "selective" formation or deposition is a formation or deposition where one material is formed or deposited relative to another stated material at a rate of at least 10:1. Ideally, the selective formation or deposition is 100% (i.e., no formation or deposition of another stated material) for the selected formation or deposition thickness of the one material. Monolayer $X_1$ includes species Y as well as one or more atoms from the immediately-surface-adjacent third material 69. In some embodiments, the stated "third material" is a combination of material 69 and monolayer $X_1$. In one embodiment, species Y is hydroxyl (—OH) wherein chemically-bonded monolayer $X_1$ is a hydroxide (e.g., Si—OH where material 69 is silicon, M-OH where material 69 is an elemental metal M, etc.). Such a monolayer, by way of example, may be formed by exposure of material 69 to an aqueous solution or vapor (e.g., at atmospheric or sub-atmospheric pressure and temperature of 0° C. to 500° C.). In one embodiment, species Y is a silyl-amide (—N[$SiR^1R^2R^3$][$R^4$], where $R^1$, $R^2$, $R^3$, and $R^4$ are H, halogen, alkyl, or aryl, or also for $R^4$ another $SiR^1R^2R^3$ group) wherein chemically-bonded monolayer $X_1$ is a silyl-amide (e.g., Si—N[$SiR^1R^2R^3$][$R^4$] where material 69 is silicon, M-N[$SiR^1R^2R^3$][$R^4$] where material 69 is an elemental metal M, etc.). Such a monolayer, by way of example, may be formed by exposure of material 69 to liquid and/or vaporized pyrrolidine, pyrrole, pyrazole and/or derivatives thereof (e.g., at atmospheric or sub-atmospheric pressure and temperature of 0° C. to 500° C.). Such a monolayer, by way of example, may be formed by exposure of material 69 to an aqueous solution or vapor. Of course, other species Y and resultant monolayers may be formed.

Figure 8:
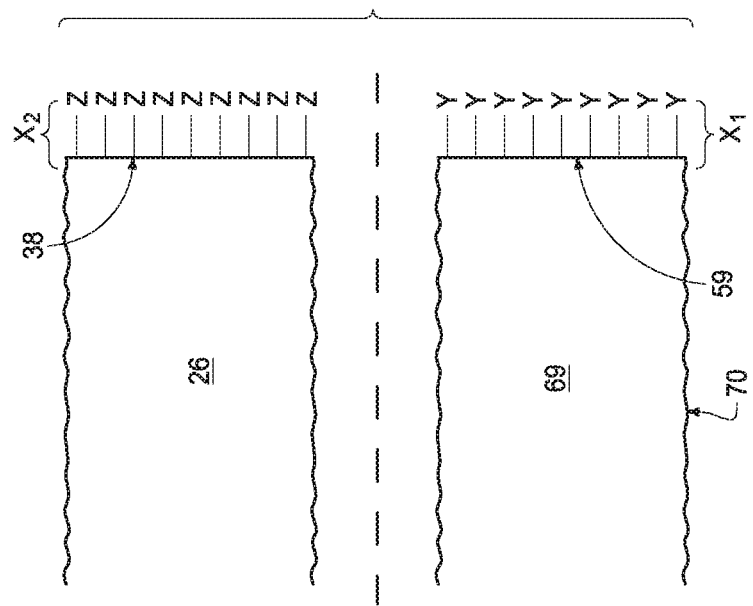
FIG. 8 is a view of the FIG. 7 construction at a processing step subsequent to that shown by FIG. 7.

Referring to FIG. 8, a chemically-bonded monolayer $X_2$ is formed on first material 26 in openings 40 selectively relative to monolayer $X_1$ bonded to third material 69 in openings 40. By way of examples only, monolayer $X_2$ may be formed as a self-assembled monolayer, for example where material 26 is an insulative oxide using octadecyltrichlorosilane (ODTS or OTS), tridecafluoro-1,1,2,2-tetrahydrooctyltrichlorosilane (FOTS), octadecyldimethylchlorosilane (ODMS), docosyltrichlorosilane (DTS), or (3-aminopropyl) trimethoxysilane (e.g., at atmospheric or sub-atmospheric pressure and temperature of 0° C. to 500° C.).

Figure 9:
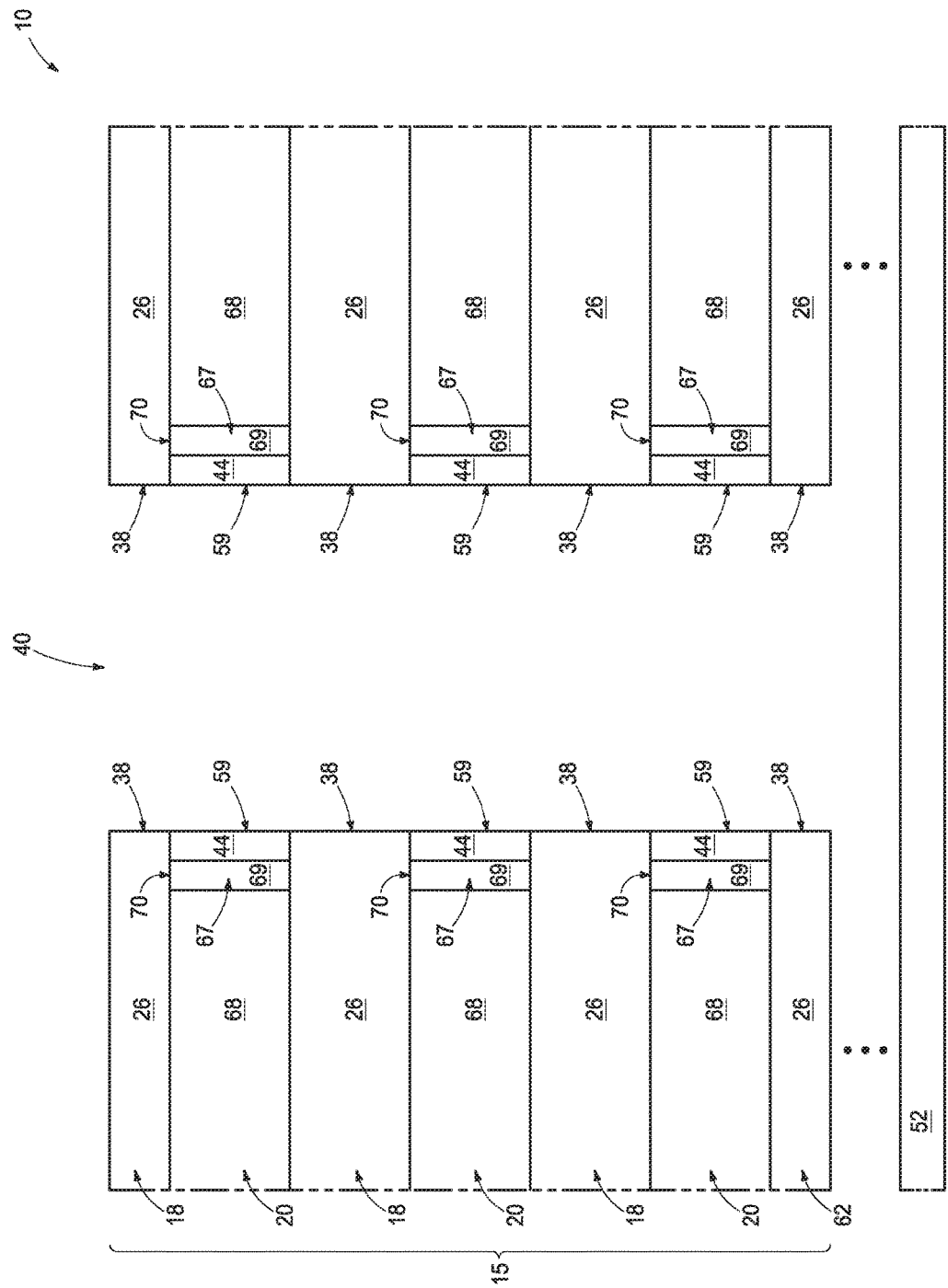
FIG. 9 is a view of the FIG. 6 construction at a processing step subsequent to that shown by FIG. 8.

Referring to FIG. 9, charge-storage material 44 has been formed in openings 44 elevationally along spaced regions 70 of third material 69 selectively relative to monolayer $X_2$ (FIG. 8) bonded to first material 26 in openings 40. In one embodiment, the third material comprises a first composition (e.g., 69) and a monolayer ($X_1$) of a second composition chemically-bonded with the first composition, the monolayer being exposed to the individual openings initially when forming the charge-storage material. Regardless, monolayer $X_1$ may be consumed within charge-storage material 44 and/or third material 69 whereby it is non-distinguishable in the finished-circuitry construction. In one embodiment, charge-storage material 44 is formed directly against material 69. Regardless, some or all of monolayer $X_2$ on first material 26 may be removed during formation of charge-storage material 44 and/or subsequently. Where, for example, monolayer $X_2$ comprises a self-assembled monolayer or other monolayer formed using organic silanes, such monolayer may be removed using any of hexadecane, chloroform, toluene, ethanol, tert-butanol, mesitylene, or hexane. Regardless, in one embodiment, charge-storage material 44 has its laterally-innermost surface 59 as being planar in vertical cross-section, in one such embodiment vertical, and in one such embodiment co-planar with surface 38 of first material 26 when such surface is planar. Alternately, charge-storage material 44 may be formed to extend laterally/radially into (not shown) openings 40 relative to first-material-sidewall surfaces 38. As another alternate example, charge-storage material 44 may be grown such that its laterally-innermost surfaces 59 are laterally/radially outward (not shown) relative to surfaces 38 of first material 26. Regardless, and as examples only, silicon nitride charge-storage material 44 may be formed selectively relative to the stated example monolayers using a silane and/or silicon tetrachloride plus ammonia at 400° C. to 680° C. and pressure of 5 mTorr to 500 Torr.

The above is but one example embodiment of forming a barrier material (e.g., $X_2$) over first material 26 in openings 40 selectively relative to third material 69 or third material 69/$X_1$ in openings 40, and regardless of whether monolayer $X_1$ is formed or any treatment might be conducted of third material 69. When a barrier material is used and remains covering first material 26 while forming charge-storage material 44, alternate barrier materials might be formed and regardless of whether such are formed as a monolayer. A couple of examples include methyloxynitride, ethyloxynitride, and $Si_xC_yN_z$. Further and alternately, monolayer $X_1$ might be formed over surface 59 of third material 69, followed by charge-storage material 44 being selectively deposited there-over in the absence of any barrier material (e.g., in the absence of $X_2$) being formed over surface 38 of first material 26.

Figure 10:
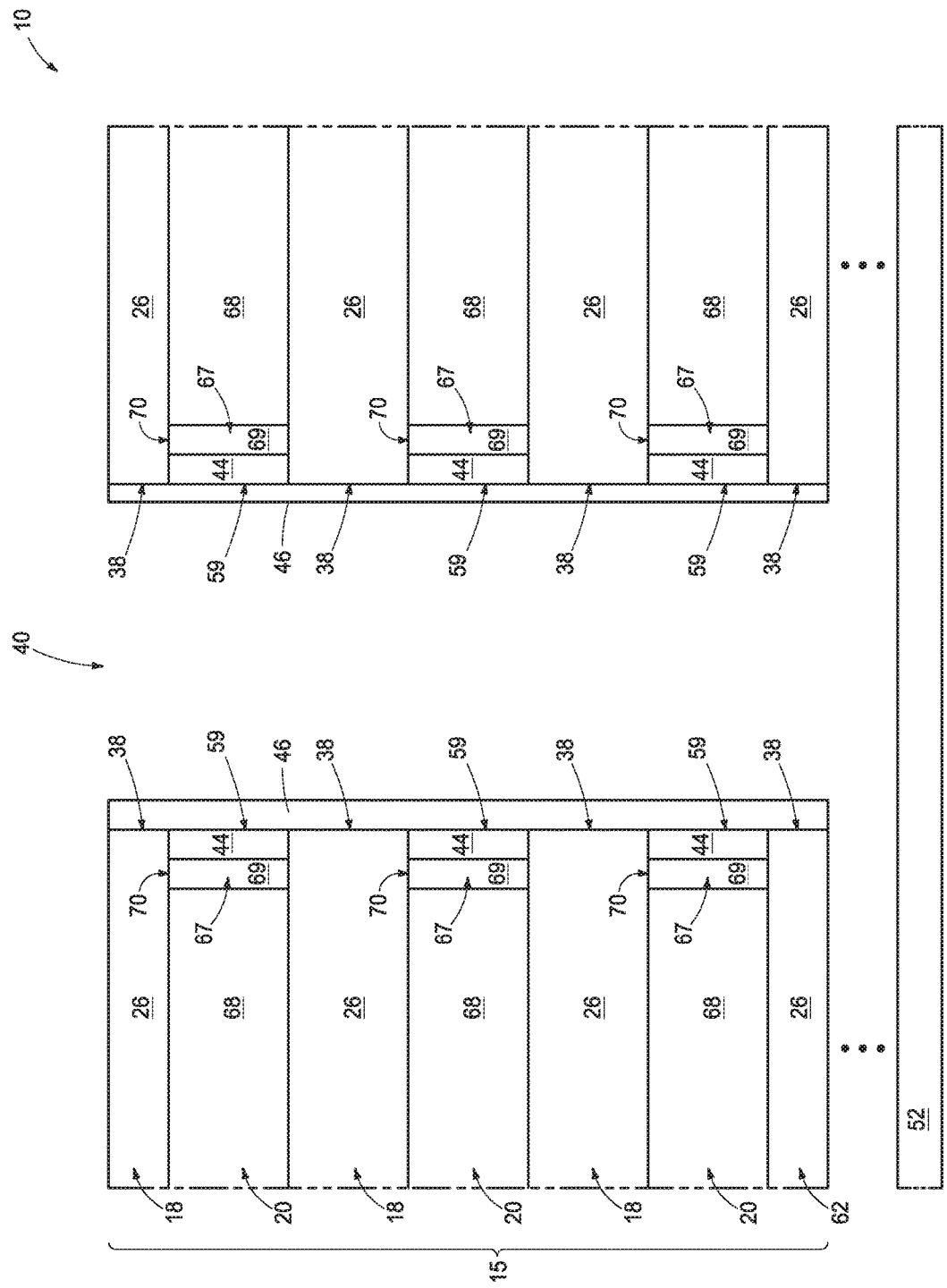
FIG. 10 is a view of the FIG. 9 construction at a processing step subsequent to that shown by FIG. 9.

Referring to FIG. 10, charge-passage material 46 is formed in openings 40 elevationally along charge-storage material 44 and second levels 20, and in one embodiment is formed there-along selectively relative to the barrier material. In one embodiment and as shown, charge-passage material 46 is formed in openings 40 continuously along first and second levels 18 and 20, respectively.

Figure 11:
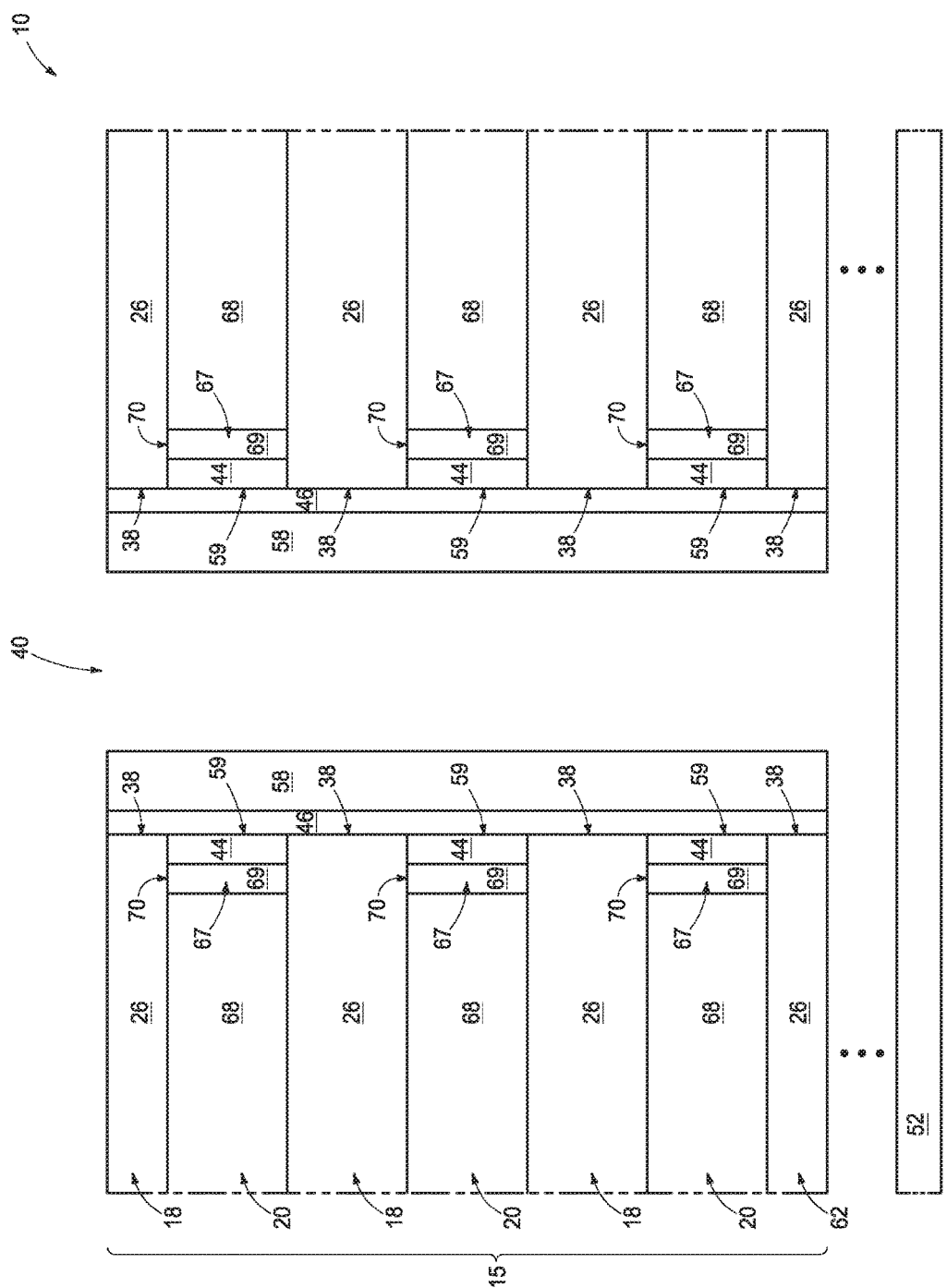
FIG. 11 is a view of the FIG. 10 construction at a processing step subsequent to that shown by FIG. 10.

Referring to FIG. 11, channel material 58 has been formed in openings 40 elevationally along charge-passage material 46 and elevationally along first levels 18. At least some of second material 68 in second levels 20 is replaced with conductive material and an elevationally-extending string of memory cells is formed in individual openings 40, with but one example resultant construction being shown in FIG. 1. The act of replacing at least some of second material 68 with conductive material may inherently form the string of memory cells or subsequent processing may also be required to do so. Regardless, such memory cells (e.g., 36) individually comprise a control-gate region (e.g., 35) comprising conductive material (e.g., 19), a charge-blocking region (e.g., a combination of at least material 32, interface 57, and the interface of materials 32 and 44), charge-storage material (e.g., 44), charge-passage material (e.g., 46), and channel material (e.g., 58). In one embodiment, all of the monolayer bonded to the first material in the openings is removed prior to forming the charge-passage material in the openings. In one such embodiment, some of the monolayer bonded to the first material in the openings is removed during the selectively forming of the charge-storage material in the openings.

Some, all, or none of third material 69 may remain in a finished-circuitry construction of a memory array fabricated in accordance with the invention, with none being shown remaining in the example embodiment of FIG. 1 (i.e., all of third material 69 has been removed in a method embodiment of producing the FIG. 1 construction). For example, the replacing of second material 68 with conductive material 19 may comprise removing (e.g., by isotropic etching) second material 68 from second levels 20 and forming conductive material 19 therein. All of third material 69 may be removed from second levels 20 prior to forming conductive material 19 and second levels 20. Insulator material 32 may be formed in second levels 20 prior to forming conductive material 19 in second levels 20, resulting in a FIG. 1-like construction.

Figure 12:
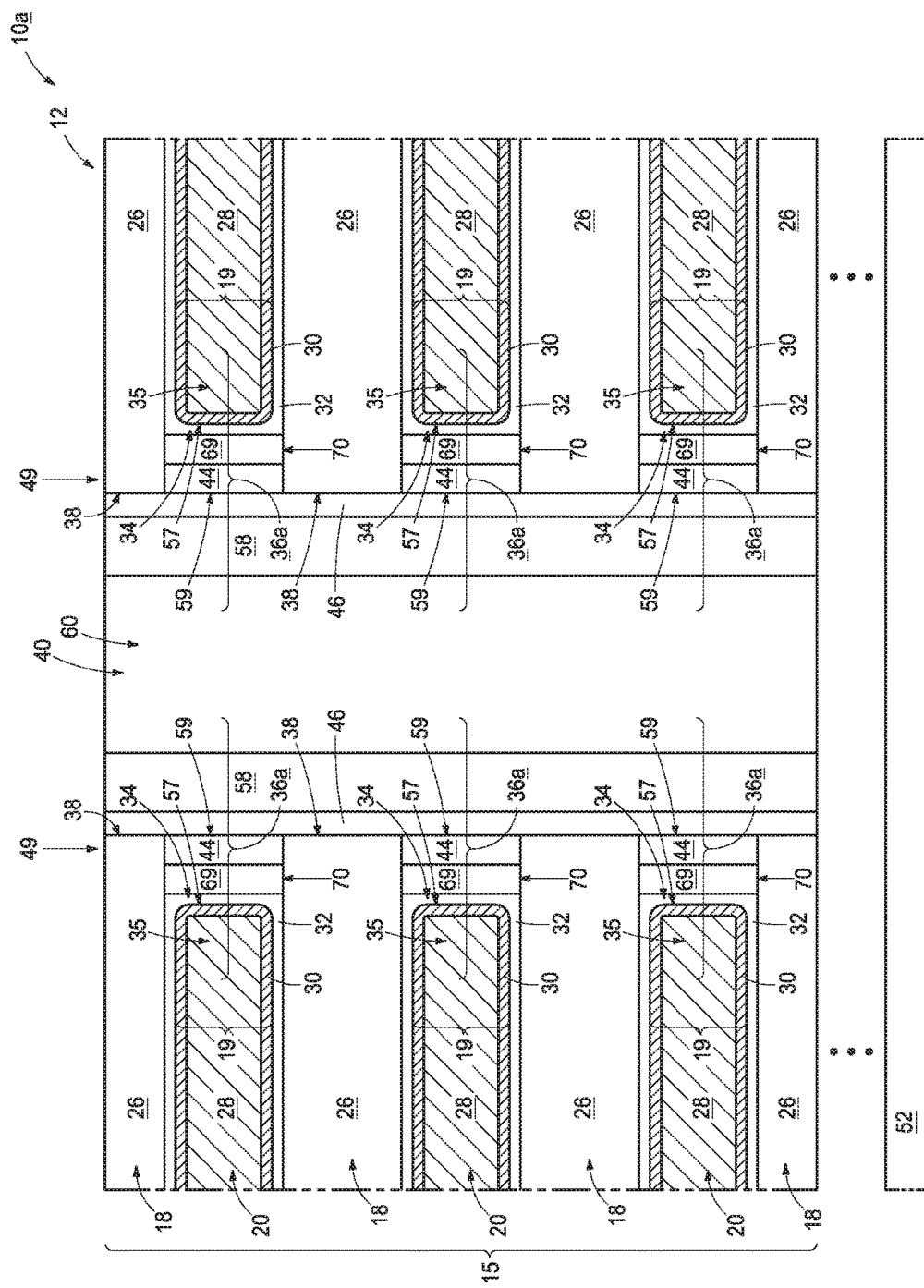
FIG. 12 is a diagrammatic cross-sectional side view of an example integrated structure having a region of an example NAND memory array.

Alternately and by way of example only, at least some of third material 69 may remain in second levels 20 after removing second material 68 wherein third material 69 remains as part of the finished-circuitry construction of the memory array such is shown in FIG. 12. Like numerals from the above-described embodiments have been used where appropriate, with some construction differences being indicated with the suffix "a" or with different numerals. Construction 10a in FIG. 12 shows third material 69 and regions 70 thereof remaining as part of memory cells 36a in the finished-circuitry construction. Third material 69 when insulative, in combination with insulator material 32, comprises a charge-blocking region of individual memory cells 36a. Any other attribute(s) or aspect(s) as shown and/or described above may be used.

Figure 13:
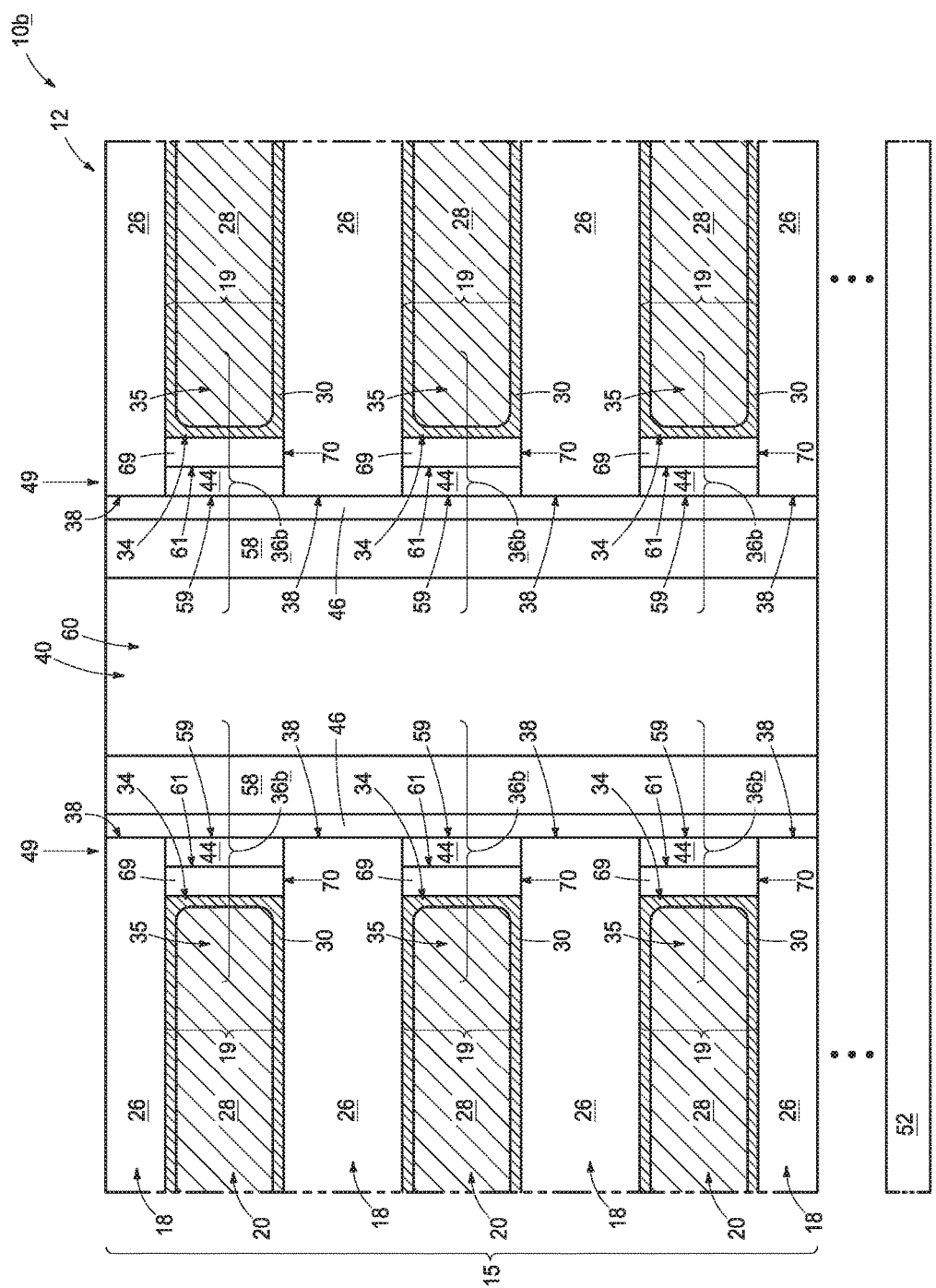
FIG. 13 is a diagrammatic cross-sectional side view of an example integrated structure having a region of an example NAND memory array.

FIG. 13 shows an alternate example embodiment to that of FIG. 12 wherein insulator 32 (not shown) of FIG. 1 has not been formed, and with at least some remnant of third material 69 being directly against conductive material 19. Like numerals from the above-described embodiments have been used where appropriate, with some construction differences being indicated with the suffix "b" or with different numerals. In construction 10b, third material 69 when insulative comprises a charge-blocking region. Third material 69 when semiconductive or conductive comprises part of individual control gate regions 35. In such instances, the charge-blocking region of individual memory cells 36b may comprise a laterally (e.g., radially) outer portion of charge-storage material 44 where such material is insulative. Regardless, an interface 61 of charge-storage material 44 and third material 69 may additionally or alternately function as a suitable charge-blocking region. Any other attribute(s) or aspect(s) as shown and/or described above may be used.

Figure 14:
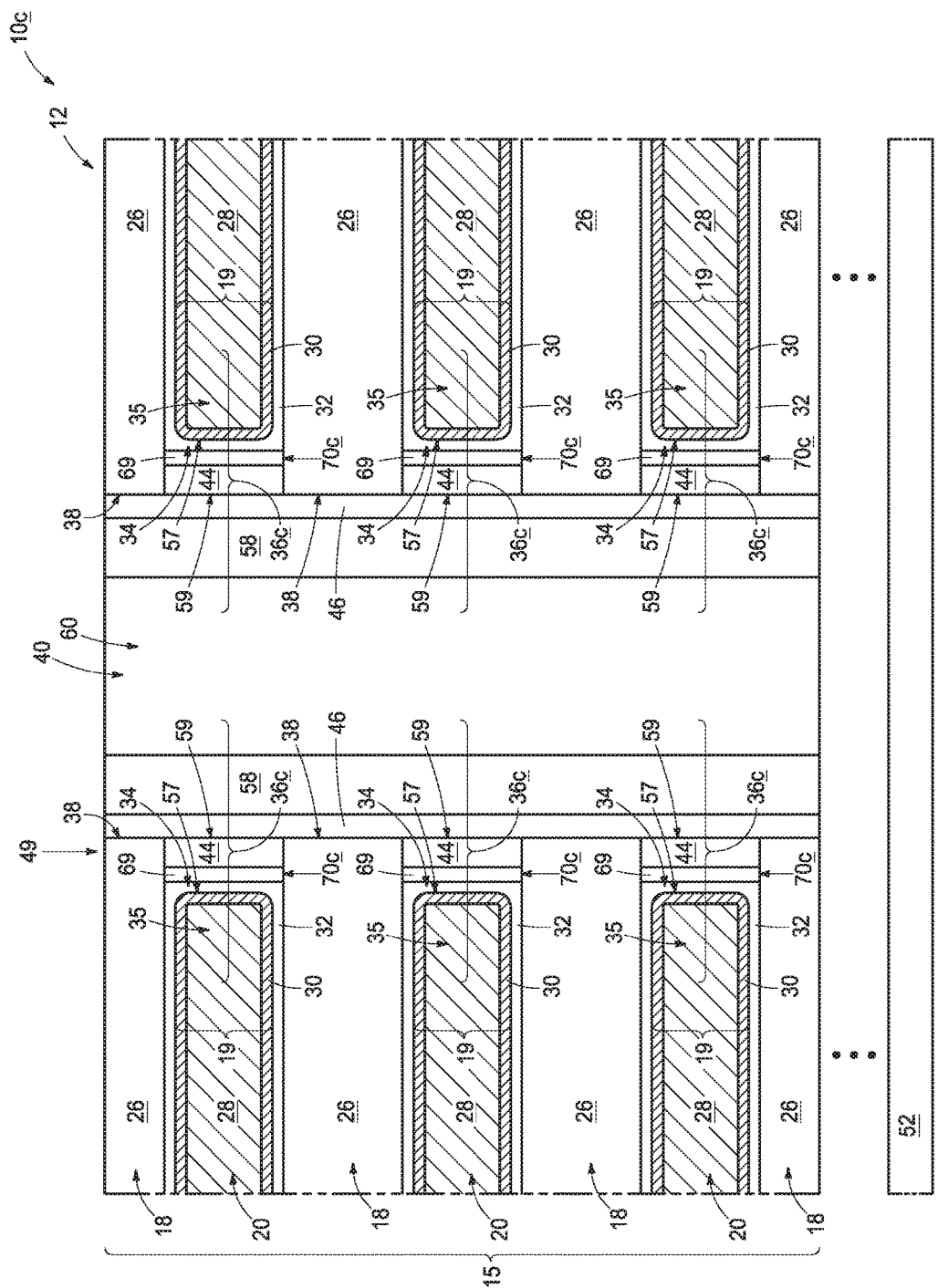
FIG. 14 is a diagrammatic cross-sectional side view of an example integrated structure having a region of an example NAND memory array.

FIG. 14 shows an alternate example embodiment construction 10c. Like numerals from the above-described embodiments have been used where appropriate, with some construction differences being indicated with the suffix "c" or with different numerals. In construction 10c, some of third material 69 in the construction of FIG. 11 has been removed prior to forming insulator material 32 and conductive material 19, leaving laterally-thinner regions 70c. Any other attribute(s) or aspect(s) as shown and/or described above may be used.

In another embodiment, at least some of the lateral thickness of third material 69 is oxidized in second levels 20 at least one of a) during the removing of second material 68, b) after the removing of second material 68, and c) during the forming of conductive material 19. For example, the act of removing second material 68 may oxidize some or all of third material 69. Alternately or additionally, some or all of third material 69 may be oxidized in a dedicated oxidation step after removal of second material 68. Alternately or additionally, the act of depositing insulator material 32 (when ultimately present) may oxidize some of all of third material 69. Regardless, some or all of the oxidized third material may be removed or remain as part of the finished-circuitry construction.

Figure 15:
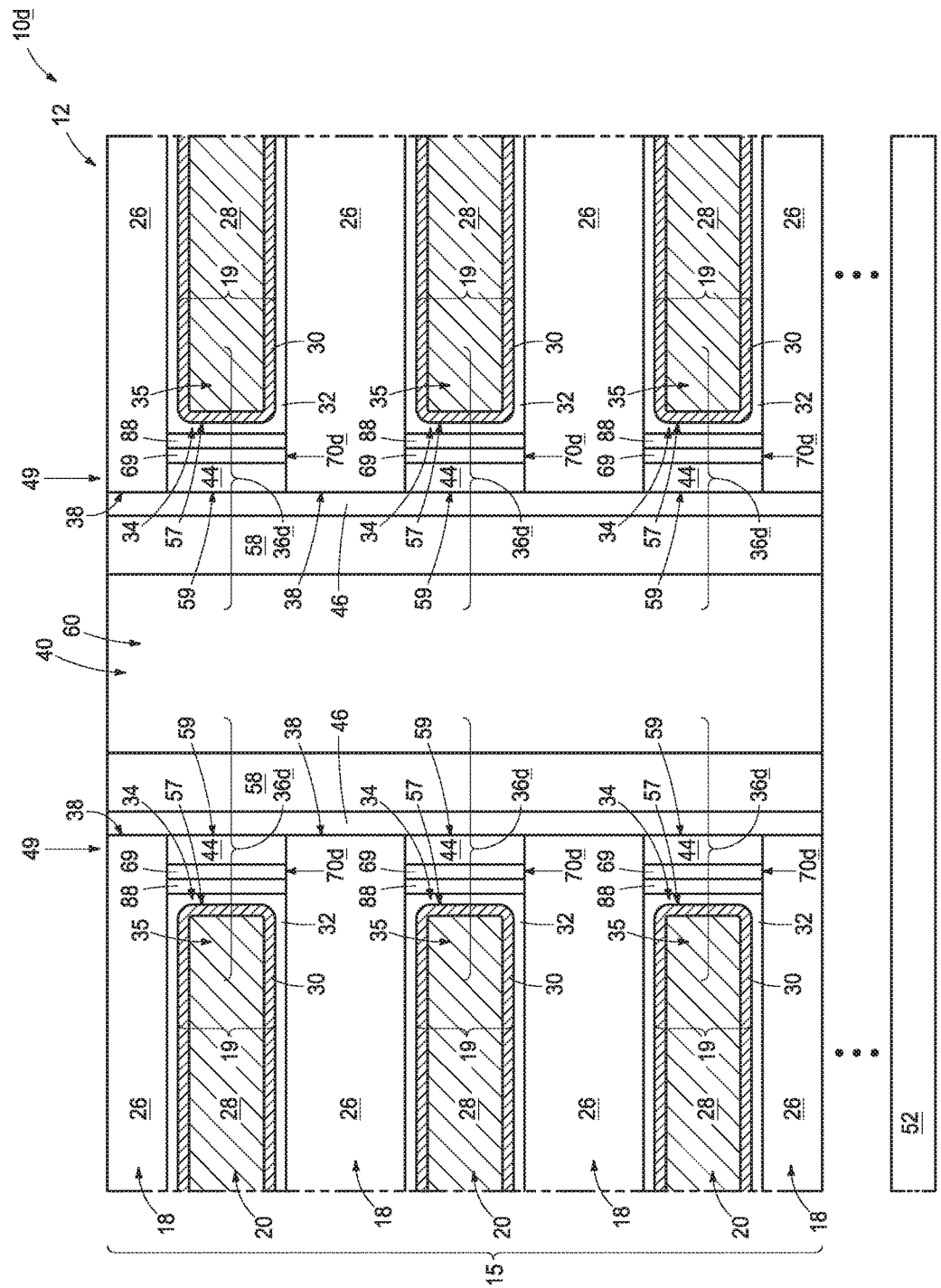
FIG. 15 is a diagrammatic cross-sectional side view of an example integrated structure having a region of an example NAND memory array.
Figure 16:
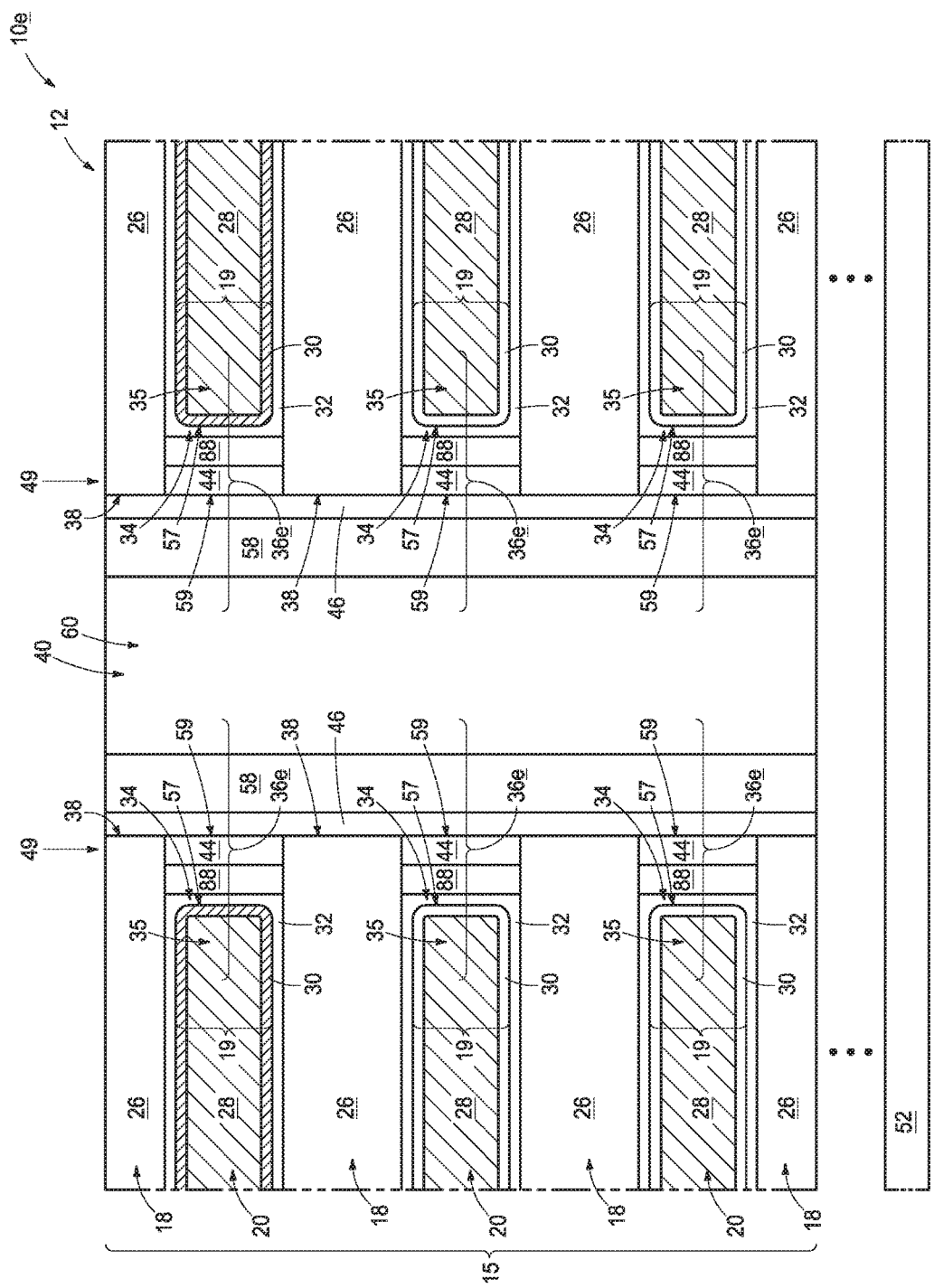
FIG. 16 is a diagrammatic cross-sectional side view of an example integrated structure having a region of an example NAND memory array.

FIG. 15 shows an example embodiment construction 10d wherein the oxidizing has only oxidized a portion of third material 69 to form an oxidized region 88 (e.g., a silicon oxide where material 69 comprises silicon, an aluminum oxide where material 69 comprises aluminum, etc.) as part of individual memory cells 36d. Like numerals from the above-described embodiments have been used where appropriate, with some construction differences being indicated with the suffix "d" or with different numerals. By way of example only, exposure of third material 69 to an oxygen-containing ambient (e.g., room air, water, $O_2$ other than room air, $O_3$, $NO_x$, etc.) at atmospheric or sub-atmospheric pressure and temperature of 0° C. to 500° C. are example conditions for oxidizing third material 69. FIG. 16 shows an example embodiment construction 10e wherein the oxidizing has oxidized all of third material 69 (not shown) to form oxidized region 88 as part of individual memory cells 36e. Like numerals from the above-described embodiments have been used where appropriate, with some construction differences being indicated with the suffix "e" or with different numerals. Regardless, in one embodiment, conductive material 19 is formed directly against (e.g., when insulator material 32 is not present, and not shown) oxidized region 88. Any other attribute(s) or aspect(s) as shown and/or described above may be used in the embodiments exemplified by FIGS. 15 and 16.

Additional example embodiments are next described with reference to FIGS. 17-22. Like numerals from the above-described embodiments have been used where appropriate, with some construction differences being indicated with the suffix "f" or with different numerals. Referring to FIG. 17, third material 69 has been formed in recesses 67 in second levels 20 in openings 40 whereby laterally (e.g., radially) innermost surfaces 59 of regions 70 are planar and co-planar with surfaces 38 of first material 26. Alternately, surfaces 59 may be laterally inward (not shown) or laterally outward (not shown) relative to surfaces 38, and regardless of whether surfaces 38 are planar and regardless of whether surfaces 59 are planar.

A chemically-bonded-organic monolayer is formed on third material 69 in openings 40 selectively relative to first material 26 in openings 40. For example and applying FIG. 7 to the embodiment of FIG. 17, monolayer $X_1$ would be organic (i.e., carbon-containing) whereby species Y is organic. By way of examples only, Y may be $(CH_2)_{17}CH_3$ or $(CH_2)_{11}CH_3$ formed by exposure to octadecyltrichlorosilane or docosyltrichlorosilane, respectively (e.g., at atmospheric or sub-atmospheric pressure and temperature of 0° C. to 500° C.). Such organic species Y may adhere to surfaces 59, for example, where third material 69 comprises an initial monolayer termination that includes elemental hydrogen chemically bonded to material 69 at surfaces 59. Formation of such initial-hydrogen-atom-terminated monolayer may occur by treating the substrate with HF by way of example only, followed by replacing such initial-hydrogen-atom-terminated monolayer on the third material with the chemically-bonded-organic monolayer (e.g., at atmospheric or sub-atmospheric pressure and temperature of 0° C. to 500° C. for each). Regardless, formation of an organic monolayer $X_1$ along third material 69 ideally has the effect of deactivating surfaces of third material 69 to preclude subsequent deposition of insulative material thereover.

Specifically, for example and as shown in FIG. 18, insulative material 80 is formed in openings 40 elevationally along first material 26 selectively relative to organic monolayer $X_1$ bonded to third material 69 in openings 40. Such may have a laterally (e.g., radially) innermost surface 73 which in one embodiment is planar in vertical cross-section (e.g., the cross-section of FIG. 18). In one embodiment, insulative material 80 is of the same composition as that of first material 26, as is exemplified in FIG. 18 by a dashed-line interface between first material 26 and insulative material 80. Insulative material 80 may be formed by any suitable technique, for example by chemical vapor deposition, atomic layer deposition, physical deposition, etc. Effective deactivation of surface 59 of third material 69 in a manner such as described above results in the depicted example FIG. 18 selective deposition of insulative material 80. In one embodiment, insulative material 80 comprises an oxide (e.g., silicon oxide, hafnium oxide, aluminum oxide, etc.). Insulative material 80 may form over top surfaces (not shown) of elevationally-outermost first material 26 and over bases (not shown) of openings 40, and which may be removed by conducting an anisotropic spacer-like etch.

Figure 19:
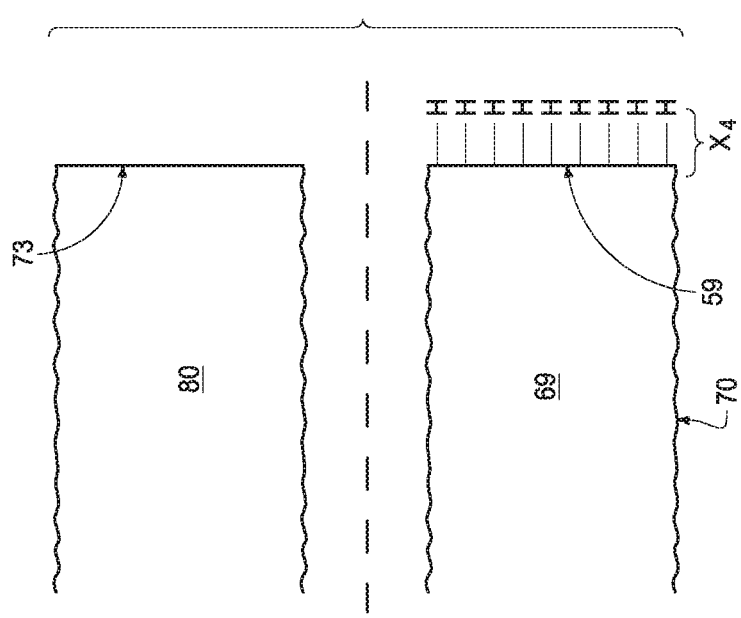
FIG. 19 is a diagrammatic enlarged view of certain materials of the FIG. 18 construction at a processing step subsequent to that shown by FIG. 18.

Referring to FIG. 19, organic monolayer $X_1$ bonded to third material 69 in openings 40 (from FIG. 7 and not shown in FIG. 19) is replaced with a hydrogen-atom-terminated monolayer $X_4$. Such may be accomplished by first removing monolayer $X_1$ of FIG. 7, followed again by exposure of the substrate to, for example, HF to achieve hydrogen-atom-terminated monolayer $X_4$ (e.g., at atmospheric or sub-atmospheric pressure and temperature of 0° C. to 500° C. for each). Such may also result in formation of an —OH terminated monolayer (not shown) on surfaces 73 of insulative material 80.

Figure 20:
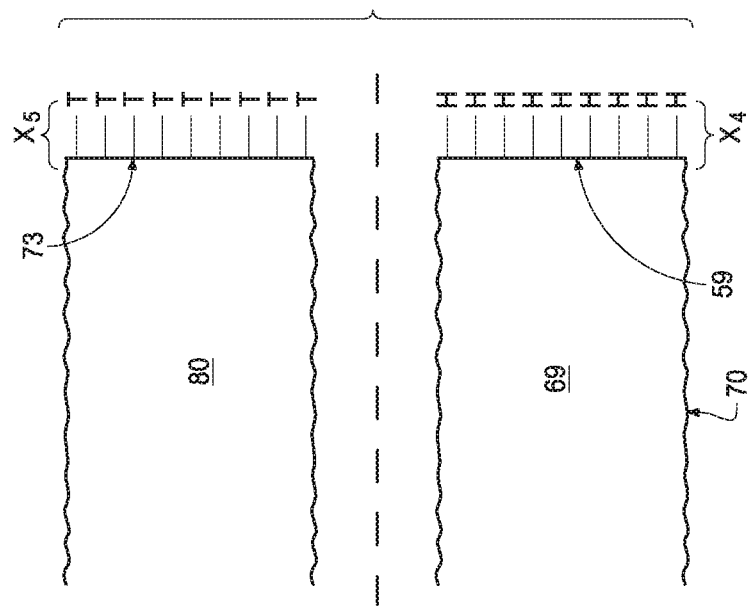
FIG. 20 is a view of the FIG. 19 construction at a processing step subsequent to that shown by FIG. 19.

Referring to FIG. 20, a chemically-bonded monolayer $X_5$ is formed on selectively-grown-insulative material 80 in openings 40 selectively relative to hydrogen-atom-terminated monolayer $X_4$. Example techniques for doing so include gas phase silation by exposure to, for example, N,N-dimethyloaminotrimethylsilane (DMATMS) or trimethylsilane, which may leave an organic species T as part of monolayer $X_5$, for example replacing any hydroxyl-terminated monolayer or material formed on or part of insulative material 80 prior to forming of monolayer $X_5$ (e.g., at atmospheric or sub-atmospheric pressure and temperature of 0° C. to 500° C.).

Referring to FIG. 21, charge-storage material 44 has been formed in openings 40 elevationally along spaced regions 70 of third material 69 selectively relative to monolayer $X_5$ (FIG. 20) bonded to selectively-grown insulative material 80 (for example using any suitable above technique). The example embodiment shown in FIG. 21 forms laterally innermost surfaces 59 of charge-storage material 44 to be planar and co-planar with surfaces 73 of selectively-grown-insulative material 80. Alternately, laterally-innermost surfaces 59 of charge-storage material 44 may be laterally (e.g., radially) inward (not shown) or laterally (e.g., radially) outward of surfaces 73 of selectively-grown-insulative material 80 and regardless of whether such surfaces 59 and/or 73 are planar. Such selective-formation of charge-storage material 44 may occur by any existing or yet-to-be-developed manners, including for example those described above.

Figure 22:
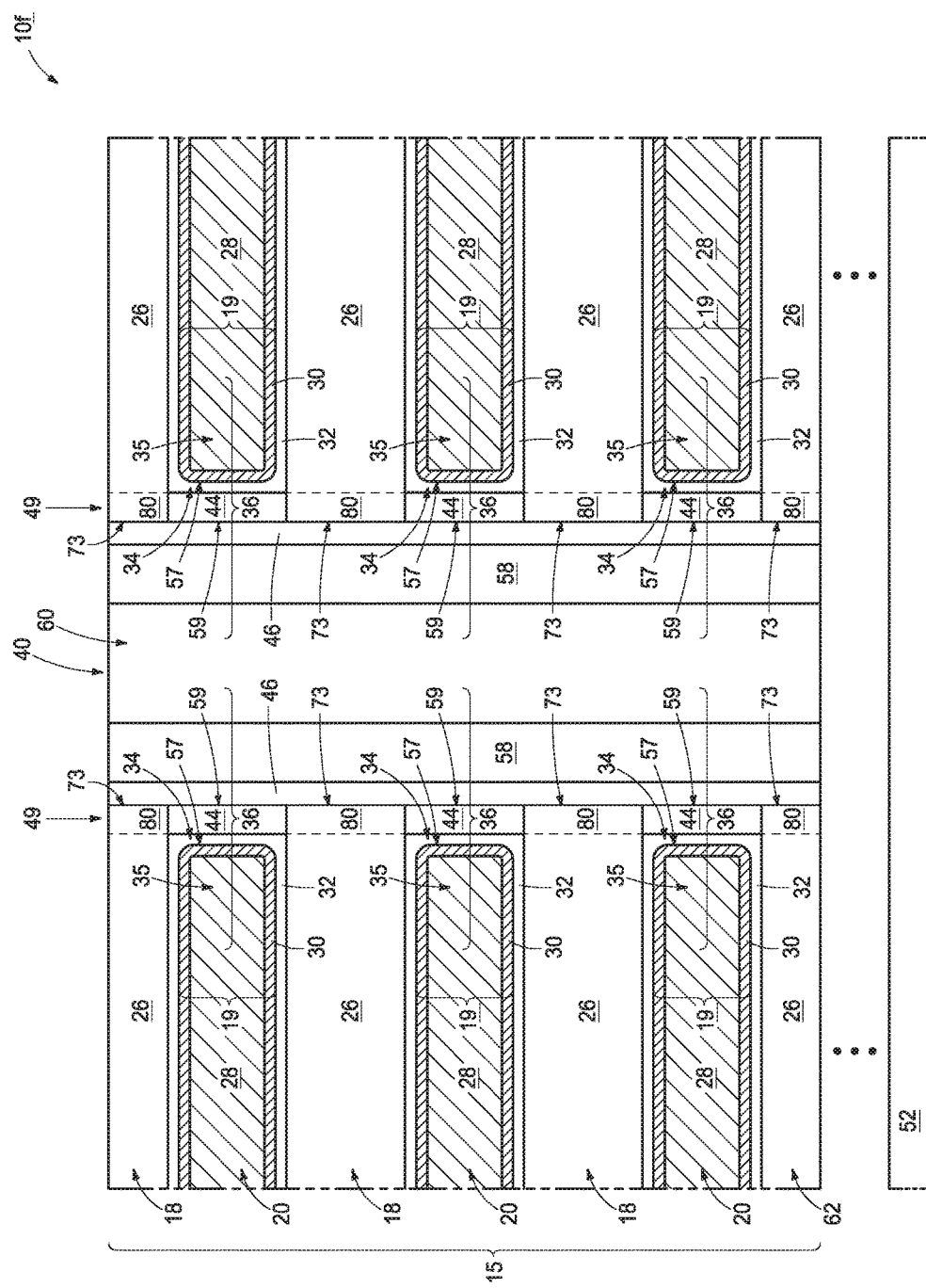
FIG. 22 is a view of the FIG. 21 construction at a processing step subsequent to that shown by FIG. 21.

Referring to FIG. 22, subsequent processing has occurred as in, or analogous to, the above-described processing. Specifically, charge-passage material 46 has been formed in openings 40 elevationally along charge-storage material 44 in second levels 20. Channel material 58 has been formed in openings 40 elevationally along charge-passage material 46 and elevationally along first level 18. Second material 68 (not shown) has been replaced in second levels 20 with conductive material 19. An elevationally-extending string 49 of memory cells 36 has been formed in individual openings 40, with memory cells 36 individually comprising a control-gate region 35 comprising conductive material 19, a charge-blocking region (e.g., at least material 32), charge-storage material 44, charge-passage material 46, and channel material 58. Any other attribute(s) or aspect(s) as shown and/or described above may be used in the embodiments exemplified by FIGS. 17-22.

In this document, unless otherwise indicated, "elevational(ly)", "higher", "upper", "lower", "top", "atop", "bottom", "above, "below", "under", "beneath", "up", and "down" are generally with reference to the vertical direction. Further, "vertical" and "horizontal" as used herein are directions that are perpendicular or within 10 degrees of perpendicular relative one another independent of orientation of the substrate in three-dimensional space. "Horizontal" refers to a general direction (i.e., within 10 degrees) along a primary substrate surface and may be relative to which the substrate is processed during fabrication. Also, "extend(ing) elevationally" and "elevationally-extending" in this document encompasses a range from vertical to no more than 45° from vertical. Further, "extend(ing) elevationally", "elevationally-extending", and "vertical(ly)" with respect to a field effect transistor are with reference to orientation of the transistor's channel length along which current flows in operation between two source/drain regions of the transistor that are at two different elevations.

Any of the materials, regions, and structures described herein may be homogenous or non-homogenous, and regardless may be continuous or discontinuous over any material which such overlie. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials ore regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

CONCLUSION

In some embodiments, a method of forming a memory array comprises forming a vertical stack of alternating first and second levels. The first levels comprise first material, the second levels comprise second material, and openings extend elevationally through the first and second levels. Vertically-spaced regions of third material are formed in the openings. Individual of the regions of the third material in the openings extend elevationally along the second material in the second levels. Charge-storage material is formed in the openings elevationally along the spaced regions of the third material selectively relative to the first levels. Charge-passage material is formed in the openings elevationally along the charge-storage material in the second levels. Channel material is formed in the openings elevationally along the charge-passage material and elevationally along the first levels. At least some of the second material in the second levels is replaced with conductive material and an elevationally-extending string of memory cells is formed in individual of the openings. The memory cells individually comprise a control-gate region comprising the conductive material, a charge-blocking region, the charge-storage material, the charge-passage material, and the channel material.

In some embodiments, A method of forming a memory array comprises forming a vertical stack of alternating first and second levels. The first levels comprise first material, the second levels comprise second material, and openings extend elevationally through the first and second levels. The second material of the second levels is laterally recessed relative to the first material of the first levels to form recesses in the second levels in the openings. Third material is formed in the recesses to form vertically-spaced regions of the third material in the openings. A chemically-bonded monolayer is formed on the third material in the openings selectively relative to the first material in the openings. A chemically-bonded monolayer is formed on the first material in the openings selectively relative to the monolayer bonded to the third material in the openings. Charge-storage material is formed in the openings elevationally along the spaced regions of the third material selectively relative to the monolayer bonded to the first material in the openings. Charge-passage material is formed in the openings elevationally along the charge-storage material in the second levels. Channel material is formed in the openings elevationally along the charge-passage material and elevationally along the first levels. At least some of the second material in the second levels is replaced with conductive material and an elevationally-extending string of memory cells is formed in individual of the openings. The memory cells individually comprise a control-gate region comprising the conductive material, a charge-blocking region, the charge-storage material, the charge-passage material, and the channel material.

In some embodiments, a method of forming a memory array comprises forming a vertical stack of alternating first and second levels. The first levels comprise first material, the second levels comprise second material, and openings extend elevationally through the first and second levels. The second material of the second levels is laterally recessed relative to the first material of the first levels to form recesses in the second levels in the openings. Third material is formed in the recesses to form vertically-spaced regions of the third material in the openings. A chemically-bonded-organic monolayer is formed on the third material in the openings selectively relative to the first material in the openings. Insulative material is formed in the openings elevationally along the first material selectively relative to the organic monolayer bonded to the third material in the openings. After forming the insulative material, the organic monolayer bonded to the third material in the openings is replaced with a hydrogen-atom-terminated monolayer. After forming the hydrogen-atom-terminated monolayer on the third material in the openings, a chemically-bonded monolayer is formed on the selectively-grown insulative material in the openings selectively relative to the hydrogen-atom-terminated monolayer. Charge-storage material is formed in the openings elevationally along the spaced regions of the third material selectively relative to the monolayer bonded to the selectively-grown insulative material in the openings. Charge-passage material is formed in the openings elevationally along the charge-storage material in the second levels. Channel material is formed in the openings elevationally along the charge-passage material and elevationally along the first levels. At least some of the second material in the second levels is replaced with conductive material and an elevationally-extending string of memory cells is formed in individual of the openings. The memory cells individually comprise a control-gate region comprising the conductive material, a charge-blocking region, the charge-storage material, the charge-passage material, and the channel material.

In some embodiments, an array of elevationally-extending strings of memory cells comprises a vertical stack of alternating insulative levels and wordline levels. The wordline levels have terminal ends corresponding to control-gate regions. Charge-storage material of individual memory cells extend elevationally along individual of the control-gate regions of the wordline levels and do not extend elevationally along the insulative levels. A charge-blocking region of the individual memory cells extends elevationally along the individual control-gate regions of the wordline levels. Channel material extends elevationally along the stack and is laterally spaced from the charge-storage material by insulative charge-passage material. All of the charge-storage material of individual of the elevationally-extending strings of memory cells is laterally outward of all of the insulative charge-passage material of the individual elevationally-extending strings of memory cells.

In some embodiments, an array of elevationally-extending strings of memory cells comprises a vertical stack of alternating insulative levels and wordline levels. The insulative levels comprising insulator material. The wordline levels have terminal ends corresponding to control-gate regions. Charge-storage material of individual memory cells extend elevationally along individual of the control-gate regions of the wordline levels and do not extend elevationally along the insulative levels. A charge-blocking region of the individual memory cells extends elevationally along the individual control-gate regions of the wordline levels. Channel material extends elevationally along the stack and is laterally spaced from the charge-storage material by insulative charge-passage material. The charge-storage material of individual of the elevationally-extending strings of memory cells and the insulator material of the insulative levels each having planar-laterally-innermost surfaces in vertical cross-section that are co-planar.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a memory array, comprising:
   forming a vertical stack of alternating first and second levels, the first levels comprising first material, the second levels comprising second material, openings extending elevationally through the first and second levels;
   forming vertically-spaced regions of third material in the openings, individual of the regions of the third material in the openings extending elevationally along the second material in the second levels
   forming charge-storage material in the openings elevationally along the spaced regions of the third material selectively relative to the first levels;
   forming charge-passage material in the openings elevationally along the charge-storage material in the second levels;
   forming channel material in the openings elevationally along the charge-passage material and elevationally along the first levels; and
   replacing at least some of the second material in the second levels with conductive material and forming an elevationally-extending string of memory cells in individual of the openings; the memory cells individually comprising a control-gate region comprising the conductive material, a charge-blocking region, the charge-storage material, the charge-passage material, and the channel material.

2. The method of claim 1 wherein the charge-passage material is formed in the openings continuously along the first and second levels.

3. The method of claim 1 comprising forming the third material directly against the second material and forming the charge-storage material directly against the third material.

4. The method of claim 3 wherein the third material comprises a first composition and a monolayer of a second composition chemically-bonded with the first composition, the monolayer being exposed to the individual openings initially when forming the charge-storage material.

5. The method of claim 1 wherein the third material comprises at least one of silicon and germanium.

6. The method of claim 1 wherein the third material comprises an elemental metal.

7. The method of claim 1 wherein the third material comprises a metal compound.

8. The method of claim 1 comprising forming a barrier material over the first material in the openings selectively relative to the third material in the openings prior to forming the charge-passage material, the charge-passage material being formed in the openings elevationally along the charge-storage material selectively relative to the barrier material.

9. The method of claim 8 comprising forming the barrier material as a monolayer.

10. The method of claim 9 comprising forming the barrier material as a self-assembled monolayer.

11. The method of claim 8 wherein the third material comprises at least one of silicon, germanium, an elemental metal, and a metal compound.

12. The method of claim 8 comprising:
    prior to forming the barrier material, forming a chemically-bonded monolayer on the third material in the opening selectively relative to the first material; and
    forming the barrier material as a monolayer.

13. The method of claim 12 wherein,
    the third material comprises at least one of silicon, germanium, an elemental metal, and a metal compound; and
    the chemically-bonded monolayer on the third material comprises a hydroxide or a silylamide.

14. The method of claim 1 wherein,
    the replacing comprises removing the second material from the second levels and forming the conductive material in the second levels; and
    the method further comprises:
    removing all of the third material from the second levels prior to forming the conductive material in the second levels.

15. The method of claim 1 wherein,
    the replacing comprises removing the second material from the second levels and forming the conductive material in the second levels; and
    the method further comprises:
    leaving at least some of the third material in the second levels after the removing and forming the conductive material in the second levels directly against the third material, the third material remaining as part of a finished construction of the memory array.

16. The method of claim 1 wherein,
    the replacing comprises removing the second material from the second levels and forming the conductive material in the second levels; and
    the method further comprises:
    oxidizing at least some lateral thickness of the third material in the second levels at least one of a) during the removing, b) after the removing, and c) during the forming of the conductive material;
    forming the conductive material directly against the oxidized third material.

17. The method of claim 16 wherein the oxidizing oxidizes all of the third material in the second levels.

18. The method of claim 1 comprising laterally recessing the second material relative to the first material in the openings prior to forming the vertically-spaced-third-material regions.

19. The method of claim 18 wherein forming the vertically-spaced-third-material regions comprises:
    depositing third material atop the stack and in the openings laterally along the first levels and in recesses formed in the second levels by the laterally recessing; and
    etching the third material to remove it from being atop the stack, from extending along the first levels, and to leave the third material in the recesses.

20. A method of forming a memory array, comprising:
    forming a vertical stack of alternating first and second levels, the first levels comprising first material, the second levels comprising second material, openings extending elevationally through the first and second levels;

laterally recessing the second material of the second levels relative to the first material of the first levels to form recesses in the second levels in the openings;

forming third material in the recesses to form vertically-spaced regions of the third material in the openings;

forming a chemically-bonded monolayer on the third material in the openings selectively relative to the first material in the openings;

forming a chemically-bonded monolayer on the first material in the openings selectively relative to the monolayer bonded to the third material in the openings;

forming charge-storage material in the openings elevationally along the spaced regions of the third material selectively relative to the monolayer bonded to the first material in the openings;

forming charge-passage material in the openings elevationally along the charge-storage material in the second levels;

forming channel material in the openings elevationally along the charge-passage material and elevationally along the first levels; and replacing at least some of the second material in the second levels with conductive material and forming an elevationally-extending string of memory cells in individual of the openings; the memory cells individually comprising a control-gate region comprising the conductive material, a charge-blocking region, the charge-storage material, the charge-passage material, and the channel material.

21. The method of claim 20 comprising removing all of the monolayer bonded to the first material in the openings prior to forming the charge-passage material in the openings.

22. The method of claim 21 comprising removing some of the monolayer bonded to the first material in the openings during the selectively forming of the charge-storage material in the openings.

23. The method of claim 20 wherein the chemically-bonded monolayer formed on the first material is organic.

24. A method of forming a memory array, comprising:
forming a vertical stack of alternating first and second levels, the first levels comprising first material, the second levels comprising second material, openings extending elevationally through the first and second levels;

laterally recessing the second material of the second levels relative to the first material of the first levels to form recesses in the second levels in the openings;

forming third material in the recesses to form vertically-spaced regions of the third material in the openings;

forming a chemically-bonded-organic monolayer on the third material in the openings selectively relative to the first material in the openings;

forming insulative material in the openings elevationally along the first material selectively relative to the organic monolayer bonded to the third material in the openings;

after forming the insulative material, replacing the organic monolayer bonded to the third material in the openings with a hydrogen-atom-terminated monolayer;

after forming the hydrogen-atom-terminated monolayer on the third material in the openings, forming a chemically-bonded monolayer on the selectively-grown insulative material in the openings selectively relative to the hydrogen-atom-terminated monolayer;

forming charge-storage material in the openings elevationally along the spaced regions of the third material selectively relative to the monolayer bonded to the selectively-grown insulative material in the openings;

forming charge-passage material in the openings elevationally along the charge-storage material in the second levels;

forming channel material in the openings elevationally along the charge-passage material and elevationally along the first levels; and replacing at least some of the second material in the second levels with conductive material and forming an elevationally-extending string of memory cells in individual of the openings; the memory cells individually comprising a control-gate region comprising the conductive material, a charge-blocking region, the charge-storage material, the charge-passage material, and the channel material.

25. The method of claim 24 comprising removing all of the monolayer bonded to the selectively-grown insulative material in the openings prior to forming the charge-passage material in the openings.

26. The method of claim 25 comprising removing some of the monolayer bonded to the selectively-grown insulative material in the openings during the selectively forming of the charge-storage material in the openings.

27. The method of claim 24 wherein the first material and the insulative material are of the same composition.

28. The method of claim 24 wherein forming the chemically-bonded-organic monolayer on the third material comprises:
forming an initial-hydrogen-atom-terminated monolayer on the third material selectively relative to the first material; and
replacing the initial-hydrogen-atom-terminated monolayer on the third material with the chemically-bonded-organic monolayer on the third material.

* * * * *